(12) United States Patent
Jin et al.

(10) Patent No.: US 12,154,738 B2
(45) Date of Patent: Nov. 26, 2024

(54) METHOD FOR MODIFYING GAS DENSITY RELAY, AND GAS DENSITY RELAY HAVING ONLINE SELF-CHECKING FUNCTION AND CHECKING METHOD THEREFOR

(71) Applicant: SHANGHAI ROYE ELECTRIC CO., LTD., Shanghai (CN)

(72) Inventors: Haiyong Jin, Shanghai (CN); Tiexin Xia, Shanghai (CN); Xiaobeng Huang, Shanghai (CN); Zhengcao Guo, Shanghai (CN); Min Chang, Shanghai (CN); Lele Wang, Shanghai (CN); Wei Zeng, Shanghai (CN); Yehong Wu, Shanghai (CN)

(73) Assignee: Shanghai Roye Electric Co., Ltd., Shanghai (CN)

( * ) Notice: Subject to any disclaimer, the term of this patent is extended or adjusted under 35 U.S.C. 154(b) by 302 days.

(21) Appl. No.: 17/640,787

(22) PCT Filed: Aug. 26, 2020

(86) PCT No.: PCT/CN2020/111247
§ 371 (c)(1),
(2) Date: Mar. 4, 2022

(87) PCT Pub. No.: WO2021/043035
PCT Pub. Date: Mar. 11, 2021

(65) Prior Publication Data
US 2022/0336172 A1    Oct. 20, 2022

(30) Foreign Application Priority Data

Sep. 4, 2019 (CN) .......................... 201910830140.4
Sep. 4, 2019 (CN) .......................... 201910830172.4
Sep. 4, 2019 (CN) .......................... 201910830184.7

(51) Int. Cl.
*H01H 35/28* (2006.01)
*G01N 9/00* (2006.01)
(Continued)

(52) U.S. Cl.
CPC ............. *H01H 35/28* (2013.01); *G01N 9/002* (2013.01); *G01N 9/36* (2013.01); *G01R 31/3275* (2013.01);
(Continued)

(58) Field of Classification Search
CPC .... G01N 9/002; G01N 9/36; G01N 2009/006; G01R 31/3275; G05D 16/2006; G05D 23/1919; H01H 35/28
See application file for complete search history.

(56) References Cited

U.S. PATENT DOCUMENTS 3,593,582 A * 7/1971 Birkmeyer .............. G01L 19/12
200/81.8
5,388,451 A    2/1995 Stendin et al.
(Continued)

FOREIGN PATENT DOCUMENTS

CN    2574047    9/2003
CN    2650118    10/2004
(Continued)

*Primary Examiner* — John Fitzgerald
(74) *Attorney, Agent, or Firm* — Hsuanyeh Law Group, PC

(57) ABSTRACT

The modification method for the gas density relay, the gas density relay with the online self-check function and the check method thereof provided by this application are used for high-voltage and medium-voltage electrical equipment, including a gas density relay body, a gas density detection sensor, a temperature regulating mechanism, an online check contact signal sampling unit and an intelligent control unit. Regulate temperature rise and fall of the temperature compensation element of the gas density relay body through the temperature regulating mechanism, which leads to a
(Continued)

contact action of the gas density relay body, the contact action is transferred to the intelligent control unit through the online check contact signal sampling unit, and the intelligent control unit detects the operating value and/or return value of the contact signal of the gas density relay body based on the density value at the time of contact action. The gas density relay check can be completed without maintainer at the site, so as to realize free maintenance, greatly improve the reliability of power grid, increase work efficiency and reduce the cost.

13 Claims, 3 Drawing Sheets

(51) Int. Cl.
  *G01N 9/36* (2006.01)
  *G01R 31/327* (2006.01)
  *G05D 16/20* (2006.01)
  *G05D 23/19* (2006.01)

(52) U.S. Cl.
  CPC ..... *G05D 16/2006* (2013.01); *G05D 23/1919* (2013.01); *G01N 2009/006* (2013.01)

(56) References Cited

U.S. PATENT DOCUMENTS

| | | | | |
|---|---|---|---|---|
| 5,629,869 A | * | 5/1997 | Johnson | H01H 11/0062 377/16 |
| 5,638,296 A | * | 6/1997 | Johnson | H01H 11/0062 377/16 |
| 2021/0043402 A1 | * | 2/2021 | Jin | H01H 71/465 |
| 2022/0336169 A1 | * | 10/2022 | Jin | G01L 7/041 |
| 2022/0336170 A1 | * | 10/2022 | Xia | H01H 35/32 |
| 2022/0390518 A1 | * | 12/2022 | Chang | G01D 21/02 |
| 2023/0168145 A1 | * | 6/2023 | Jin | H01H 35/36 73/49.3 |
| 2023/0168302 A1 | * | 6/2023 | Huang | G01N 9/266 324/415 |
| 2023/0221370 A1 | * | 7/2023 | Jin | H01H 35/28 324/418 |

FOREIGN PATENT DOCUMENTS

| | | | | |
|---|---|---|---|---|
| CN | 101937060 | | 1/2011 | |
| CN | 201796123 | | 4/2011 | |
| CN | 104299843 | | 1/2015 | |
| CN | 204165926 | | 2/2015 | |
| CN | 104460480 | | 3/2015 | |
| CN | 103913704 | | 8/2017 | |
| CN | 206401232 | | 8/2017 | |
| CN | 108226768 | | 6/2018 | |
| CN | 108872847 | | 11/2018 | |
| CN | 109752649 | | 5/2019 | |
| CN | 110441195 | | 11/2019 | |
| CN | 110501260 A | * | 11/2019 | ........... G05B 19/048 |
| CN | 110530758 | | 12/2019 | |
| CN | 110542852 | | 12/2019 | |

\* cited by examiner

METHOD FOR MODIFYING GAS DENSITY RELAY, AND GAS DENSITY RELAY HAVING ONLINE SELF-CHECKING FUNCTION AND CHECKING METHOD THEREFOR

The present application claims priority for the following patent applications:

1. Application Number: 201910830172.4 (Title: Gas Density Relay with Online Self-check Function and Check Method thereof) applied on Sep. 4, 2019;
2. Application Number: 201910830184.7 (Title: Gas Density Relay with Online Self-check Function and Check Method thereof) applied on Sep. 4, 2019;
3. Application Number: 201910830140.4 (Title: Gas Density Relay Modification Method) applied on Sep. 4, 2019.

TECHNICAL FIELD

The invention relates to the technical field of electric power, in particular to a gas density relay with an online self-check function, a check method thereof and a modification method for the gas density relay applied to high-voltage and medium-voltage electrical equipment.

BACKGROUND

At present, SF6 (sulfur hexafluoride) electrical equipment has been widely applied to electric power departments and industrial and mining enterprises, and has promoted rapid development of electric power industry. With the rapid development of economy, the capacity of electric power systems in China has expanded rapidly in recent years, and more and more SF6 electrical equipment is consumed. SF6 gas functions in arc extinction and insulation in high-voltage electrical equipment, and safety operation of the SF6 high-voltage electrical equipment is severely affected if the density of SF6 gas in the high-voltage electrical equipment is reduced and micro-water content exceeds standards: 1) insulation and arc extinction performances are lost if the density of SF6 gas is reduced to a certain degree. 2) With the participation of some metals, SF6 gas can hydrolyze with water at a temperature above 200° C., generate active HF and $SOF_2$, corrode insulating parts and metal parts and generate a lot of heat to increase the pressure of the air chamber. 3) When the temperature is reduced, excessive water may form condensed water, which significantly reduces the surface insulation strength of the insulating parts, and even causes flashover and serious harm. Therefore, the power grid operating procedure compulsively stipulates that the density of SF6 gas and the water content should be tested regularly before and during operation of the equipment.

The networked and digital development of unattended substations and the increasingly rising requirements for remote control and telemetry are of vital practical significance for online monitoring of the gas density and the micro-water content of the SF6 electrical equipment. With the continuous rapid development of China's smart power grids, as an important component and key node of a smart substation, smart high-voltage electrical equipment plays a pivotal role in the safety of the smart power grids. At present, most high-voltage electrical equipment is SF6 gas insulation equipment. If the gas density is reduced (due to leakage and the like), the electrical performance of the equipment is severely affected, which causes serious potential hazards in safety operation. At present, online monitoring of gas density values in the SF6 high-voltage electrical equipment has been extremely widespread, so that application of gas density monitoring systems (gas density relays) is flourishing. However, the current gas density monitoring systems (gas density relays) basically function in: 1) Acquiring and uploading density, pressure and temperature by the aid of remote-transmission SF6 gas density relays, so as to realize online monitoring of the gas density. 2) Acquiring and uploading density, pressure and temperature by the aid of gas density transmitters, so as to realize online monitoring of the gas density. The SF6 gas density relays are core and critical components. However, due to the harsh environment of field operation of high-voltage substations, particularly strong electromagnetic interference, among the gas density monitoring systems (gas density relays) that are used currently, the remote-transmission SF6 gas density relays include mechanical density relays and electronic remote transmission parts; in addition, traditional mechanical density relays are still retained in power grid systems using the gas density transmitters. The mechanical density relays are provided with one group, two groups or three groups of mechanical contacts, information can be transmitted to a target equipment terminal through a contact connecting circuit when pressure reaches the state of alarm, blocking or overpressure, and safety operation of the equipment is ensured. Meanwhile, the monitoring systems have safe and reliable circuit transmission functions. An effective platform is built to achieve real-time data and remote data reading and information monitoring, and information such as pressure, temperature and density can be timely transmitted to target equipment (such as a computer terminal), so as to realize online monitoring.

Regularly checking the gas density relays on the electrical equipment is a necessary measure for nipping in the bud and guaranteeing safe and reliable operation of the electrical equipment. Both Preventive Test Procedure for Electric Power and Twenty-five Key Requirements for Preventing Major Accidents in Electric Power Production require regular checking for the gas density relays. According to practical operation, regularly checking the gas density relays is one of necessary measures for guaranteeing safe and reliable operation of the electrical equipment. Therefore, check of the gas density relays has been already attached great importance to and popularized at present, and various power supply companies, power plants and large factory and mining enterprises have already implemented check of the gas density relays. In order to achieve field check and detection of the gas density relays, the power supply companies, the power plants and the large factory and mining enterprises require testers, equipment vehicles and high-value SF6 gas. According to rough calculation, including business loss due to power outage during detection, the annually shared detection cost of each high-voltage switching station is around tens of thousands to hundreds of thousands yuan. In addition, there are potential safety hazards if testers do not perform standard operation during field check. Therefore, it is quite necessary to innovate in existing gas density relays with gas density self-check functions, particularly in the gas density online self-check gas density relays or systems, so that the gas density relays realizing online monitoring of the gas density or composed monitoring systems also have the check function of gas density relays, so as to achieve regular check operation of the (mechanical) gas density relays.

SUMMARY

The invention aims to provide a gas density relay modification method, a gas density relay with an online self-check function and a check method thereof, so as to solve the problems raised in the above background.

In order to achieve the above purpose, the invention adopts the following technical scheme:

In the first aspect, the present application provides a gas density relay (or gas density monitoring device) with an online self-check function, which includes a gas density relay body, a gas density detection sensor, a temperature regulating mechanism, an online check contact signal sampling unit and an intelligent control unit;

The temperature regulating mechanism is a regulating mechanism capable of regulating temperature and configured to regulate temperature rise and fall of a temperature compensation element of the gas density relay body, so that the gas density relay body takes contact signal action;

The gas density detection sensor is communicated with the gas density relay body;

The online check contact signal sampling unit is directly or indirectly connected with the gas density relay body and configured to sample contact signals generated when contacts of the gas density relay body take action;

The intelligent control unit is respectively connected with the gas density detection sensor, the temperature regulating mechanism and the online check contact signal sampling unit and configured to complete control of the temperature regulating mechanism, pressure value acquisition, temperature value acquisition and/or gas density value acquisition and detect contact signal operating values and/or return values of the gas density relay body;

The contact signals include alarm signals and/or blocking signals.

Preferably, the gas density relay body includes but is not limited to a gas density relay of bimetallic strip compensation, a gas density relay of gas compensation, a gas density relay of hybrid compensation of bimetallic strips and gas; a completely mechanical gas density relay, a digital gas density relay, a mechanical and digital combined gas density relay; a gas density relay with a pointer displaying function, a digital display type gas density relay, a gas density switch without a displaying or indicating function; an SF6 gas density relay, an SF6 hybrid gas density relay and an N2 gas density relay.

Preferably, the gas density relay body includes a housing, a base, a pressure detector, a temperature compensation element and at least one signal generator, wherein the base, the pressure detector, the temperature compensation element and the signal generators are arranged in the housing; each signal generator includes a micro-switch or magnetic assisted electric contact, and the gas density relay body outputs contact signals through the signal generators; the pressure detector includes a Bourdon tube or bellow; the temperature compensation element adopts a temperature compensation piece or gas sealed in the housing.

More preferably, the online check contact signal sampling unit is connected with the signal generators.

More preferably, the gas density relay body also comprises a display mechanism including a movement, a pointer and a dial, and the movement is fixed on the base or in the housing; the other end of the temperature compensation element is also connected with the movement through a connecting rod or directly connected with the movement; the pointer is installed on the movement and before the dial, and the pointer displays the gas density value in combination with the dial; and/or the display mechanism comprises a digital device or a liquid crystal device with an indication display.

More preferably, the gas density relay body or intelligent control unit further includes a contact resistance detection unit, and the contact resistance detection unit is connected with the contact signals or directly connected with the signal generators; the contact signals of the gas density relay body are isolated with a control loop of the body under the control of the online check contact signal sampling unit, and the contact resistance detection unit can detect contact resistance values of contacts of the gas density relay body when the contact signals of the gas density relay body take action and/or instructions for detecting contact resistance of the contacts are received.

More preferably, the gas density relay body or intelligent control unit further includes an insulation resistance detection unit, and the insulation resistance detection unit is connected with the contact signals or directly connected with the signal generators; the contact signals of the gas density relay body are isolated with the control loop of the body under the control of the online check contact signal sampling unit, and the insulation resistance detection unit can detect insulation resistance values of the contacts of the gas density relay body when the contact signals of the gas density relay body take action and/or instructions for detecting insulation resistance of the contacts are received.

Preferably, the temperature regulating mechanism is a heating element; alternatively, the temperature regulating mechanism includes a heating element, a heat insulation element, a temperature controller, a temperature detector and a temperature regulating mechanism outer shell; alternatively, the temperature regulating mechanism includes a heating element and a temperature controller; alternatively, the temperature regulating mechanism includes a heating element, a heating power regulator and a temperature controller; alternatively, the temperature regulating mechanism includes a heating element, a refrigeration element, a heating power regulator and a temperature controller; alternatively, the temperature regulating mechanism includes a heating element, a heating power regulator and a thermostatic controller; alternatively, the temperature regulating mechanism includes a heating element, a temperature controller and a temperature detector; alternatively, the temperature regulating mechanism is a heating element, and the heating element is arranged near the temperature compensation element; alternatively, the temperature regulating mechanism is a miniature constant temperature box;

The number of the heating element is at least one, and each heating element includes but is not limited to one of a silicon rubber heater, a resistance wire, an electric heating tape, an electric heating rod, a hot gas fan, an infrared ray heating element and a semiconductor;

The temperature controller is connected with the heating elements and used for controlling the heating temperature of the heating elements, and the temperature controller includes but is not limited to one of a PID controller, a controller combining PID with fuzzy control, an inverter controller and a PLC controller.

More preferably, the heating elements in the temperature regulating mechanism include at least two heating elements with the same power or different power, or include heating elements capable of regulating heating power.

More preferably, the positions of at least two heating elements can be the same or different, and the heating elements can be reasonably arranged as required.

More preferably, temperature rise and fall of the temperature regulating mechanism is in a multilevel control mode.

Preferably, temperature change speed per second approaching an operating value is not more than 1.0 DEG C. (or requirements are set as required) when the temperature regulating mechanism measures the contact signal operating value of the gas density relay through control of the intelligent control unit, namely, the temperature is required to rise or fall steadily.

Preferably, the gas density relay (or gas density monitoring device) further includes a mutual self-check unit, and the intelligent control unit compares data detected by the mutual self-check unit, so that the gas density relay is free from maintenance; alternatively, the intelligent control unit and the mutual self-check unit compare the detected data, so that the gas density relay is free from maintenance.

Preferably, the intelligent control unit further includes a depth calculation unit, and the depth calculation unit can provide a gas source suitable for check initial density for gas density relays to be checked according to ambient temperature values, gas density values or pressure values of electrical equipment and gas pressure-temperature characteristics; alternatively, the intelligent control unit provides a gas source suitable for check initial density for gas density relays to be checked according to ambient temperature values during check, gas pressure values of an air chamber of the electrical equipment, temperature values of the gas density relays to be checked and gas pressure-temperature characteristics.

Preferably, the gas density detection sensor is arranged on the gas density relay body; alternatively, the temperature regulating mechanism is arranged inside or outside the gas density relay body; alternatively, the gas density detection sensor, the online check contact signal sampling unit and the intelligent control unit are arranged on the gas density relay body; alternatively, the temperature regulating mechanism, the gas density detection sensor, the online check contact signal sampling unit and the intelligent control unit are arranged on the gas density relay body.

More preferably, the gas density relay body and the gas density detection sensor are structurally integrated; preferably, the gas density relay body and the gas density detection sensor form a structurally integrated remote-transmission gas density relay.

Preferably, the gas density detection sensor is structurally integrated.

More preferably, the gas density detection sensor is a structurally integrated gas density transmitter; preferably, the online check contact signal sampling unit and the intelligent control unit are arranged on the gas density transmitter.

Preferably, the gas density detection sensor includes at least one pressure sensor and at least one temperature transducer; alternatively, the gas density detection sensor is the gas density transmitter comprising the pressure sensors and the temperature transducers; alternatively, the gas density detection sensor is a density detection sensor adopting a quartz tuning fork technology.

More preferably, the pressure sensors are mounted on a gas path of the gas density relay body.

More preferably, the temperature transducers are mounted on or outside the gas path of the gas density relay body, or in the gas density relay body, or near the temperature compensation element in the gas density relay body, or outside the gas density relay body.

More preferably, the temperature sensor may be a thermocouple, a thermistor, a semiconductor type, a contact type and a non-contact type, a thermal resistance and the thermocouple.

More preferably, at least one temperature transducer is arranged near the temperature compensation element of the gas density relay body or on the temperature compensation element, or integrated in the temperature compensation element. Preferably, at least one temperature transducer is arranged at one end, close to the temperature compensation element, of the pressure detector of the gas density relay body.

More preferably, the pressure sensor includes but is not limited to a relative pressure sensor and/or an absolute pressure sensor.

Further, when the pressure sensor is the absolute pressure sensor, expressed by an absolute pressure value, a check result is an absolute pressure value corresponding to 20 DEG C.; expressed by a relative pressure value, the check result is converted into a relative pressure value corresponding to 20 DEG C.;

When the pressure sensor is the relative pressure sensor, expressed by a relative pressure value, the check result is a relative pressure value corresponding to 20 DEG C.; expressed by an absolute pressure value, the check result is converted into an absolute pressure value corresponding to 20 DEG C.;

The conversion relationship between the absolute pressure value and the relative pressure value is as follows:

$$P_{absolute\ pressure} = P_{relative\ pressure} + P_{standard\ atmospheric\ pressure}$$

Further, the pressure sensor may be a diffusion silicon pressure sensor, an MEMS pressure sensor, a chip pressure sensor, a coil induction pressure sensor (such as a pressure sensor where a Bourdon tube is attached with an induction coil), a resistance pressure sensor (such as a pressure sensor where a Bourdon tube is attached with a slide wire resistance), an analog pressure sensor and a digital pressure sensor.

Preferably, the online check contact signal sampling unit and the intelligent control unit are arranged together.

More preferably, the online check contact signal sampling unit and the intelligent control unit are sealed in a cavity or housing.

Preferably, the gas density relay (or gas density monitoring device) further includes a pressure regulating mechanism, and a gas path of the pressure regulating mechanism is communicated with the gas density relay body; the pressure regulating mechanism is configured to regulate pressure rise and fall of the gas density relay body to be matched and/or combined with the temperature regulating mechanism, so that the gas density relay body takes contact signal action, and the intelligent control unit is connected with the pressure regulating mechanism to complete control of the pressure regulating mechanism; alternatively, the gas density relay (or gas density monitoring device) further includes a heating member, and the intelligent control unit is connected with the heating member; alternatively, the gas density relay (or gas density monitoring device) further includes an air chamber and a heating member, the air chamber is communicated with the gas density relay body, the heating member is arranged outside or inside the air chamber, and the intelligent control unit is connected with the heating member.

More preferably, a gas path of the pressure regulating mechanism is communicated with the pressure detector of the gas density relay body.

More preferably, the pressure regulating mechanism is sealed in a cavity or housing.

More preferably, during check, the pressure regulating mechanism is a closed air chamber, a heating element and/or a refrigeration element is arranged outside or inside the closed air chamber, heating is achieved through the heating element, and/or refrigeration is achieved through the refrigeration element, so that the temperature of gas in the closed air chamber is changed, and pressure rise and fall of the gas density relay is completed.

Further, the heating element and/or the refrigeration element are semiconductors.

Further, the pressure regulating mechanism further includes a heat insulation element, and the heat insulation element is arranged outside the closed air chamber.

More preferably, during check, the pressure regulating mechanism is a cavity with an opening at one end, and the other end of the cavity is communicated with the gas density relay body; a piston is arranged in the cavity, one end of the piston is connected with a regulating rod, the outer end of the regulating rod is connected with a drive part, the other end of the piston extends into the opening and hermetically contacts with the inner wall of the cavity, and the drive part drives the regulating rod to drive the piston to move in the cavity.

More preferably, during check, the pressure regulating mechanism is a closed air chamber, a piston is arranged in the closed air chamber, the piston hermetically contacts with the inner wall of the closed air chamber, and a drive part is arranged outside the closed air chamber and pushes the piston to move in the cavity through electromagnetic force.

More preferably, the pressure regulating mechanism is an airbag with one end connected with the drive part, the volume of the airbag is changed under drive of the drive part, and the airbag is communicated with the gas density relay body.

More preferably, the pressure regulating mechanism is a bellow, one end of the bellow is communicated with the gas density relay body, and the other end of the bellow extends and retracts under the drive of the drive part.

The drive part in the pressure regulating mechanism induces but is not limited to one of magnetic force, a motor (inverter motor or stepping motor), a reciprocating motion mechanism, a Carnot cycle mechanism and a pneumatic element.

More preferably, the pressure regulating mechanism is a deflation valve.

Further, the pressure regulating mechanism further includes a flow valve for controlling gas release flow.

Further, the deflation valve is a solenoid valve or valve with electrically motorized operation, or other valves for deflating by means of electricity or gas.

More preferably, the pressure regulating mechanism is a compressor.

More preferably, the pressure regulating mechanism is a pump.

Further, the pump includes but is not limited to one of a pressure pump, a booster pump, an electrical gas pump and an electromagnetic gas pump.

More preferably, the gas density relay (or gas densinclu-detoring device) further includes a valve, a connector communicated with the electrical equipment is arranged at one end of the valve, and the other end of the valve is communicated with the pressure regulating mechanism and the gas path of the gas density relay body.

Further, the valve is connected with the intelligent control unit, and the valve is closed or opened under the control of the intelligent control unit.

Further, the other end of the valve is communicated with the base of the gas density relay body and the pressure detector, or the other end of the valve is connected with the gas path of the pressure regulating mechanism, so that the valve is communicated with the base and the pressure detector.

Further, the valve is a valve with electrically motorized operation.

Further, the valve is a solenoid valve.

Furthermore, the valve is a permanent magnet solenoid valve.

Further, the valve is a piezoelectric valve or temperature control valve or novel valve made of intelligent memory materials and opened or closed in an electrical heating manner.

Further, the valve is closed or opened in a hose bending or clamping manner.

Further, the valve is sealed in a cavity or housing.

Further, the valve and the pressure regulating mechanism are sealed in a cavity or housing.

Further, pressure sensors are arranged on two sides of a gas path of the valve respectively.

Further, the valve is communicated with the electrical equipment through an electrical equipment connector.

Further, the gas density relay (or gas density monitoring device) further includes a self-sealing valve which is mounted between the electrical equipment and the valve; alternatively, the valve is mounted between the electrical equipment and the self-sealing valve.

Further, the gas density relay (or gas density monitoring device) further includes an air admission interface which is formed in the pressure regulating mechanism; alternatively, the air admission interface is formed in the electrical equipment; alternatively, the air admission interface is formed between the electrical equipment and the valve; alternatively, the air admission interface is formed in a second connecting tube, which is communicated with the valve and the gas path of the pressure regulating mechanism or communicated with the valve and the gas density relay body.

Preferably, the electrical equipment includes SF6 gas electrical equipment, SF6 mixed gas electrical equipment, environmental protection gas electrical equipment, or other insulating gas electrical equipment.

Specifically, the electrical equipment includes a GIS, a GIL, a PASS, a circuit breaker, a current transformer, a voltage transformer, a transformer, an inflatable cabinet and a ring main unit.

Preferably, contact signals of the gas density relay body are sampled by the online check contact signal sampling unit under the condition: the online check contact signal sampling unit has at least one group of independent sampling contacts, so that at least one contact can be automatically checked at the same time, continuous measurement is achieved without replacing the contacts or reselecting the contacts; each contact induces but is not limited to one of an alarm contact, an alarm contact+blocking contact, an alarm contact+blocking contact 1+blocking contact 2 and an alarm contact+blocking contact+overpressure contact.

Preferably, the testing voltage of the online check contact signal sampling unit for contact signal operating values or switching values of the gas density relay body is not lower than 24V, namely, voltage not lower than 24V is applied between corresponding terminals of contact signals during check.

Preferably, the intelligent control unit acquires gas density values collected by the gas density detection sensor; alternatively, the intelligent control unit acquires pressure values and temperature values collected by the gas density detection sensor, so that the gas density relay body is online monitored by the gas density relay, namely, the gas density of the monitored electrical equipment is online monitored by the gas density relay.

More preferably, the intelligent control unit calculates the gas density values by an averaging method (mean value method). The averaging method includes: setting collection frequency at set time intervals, and averaging all collected N gas density values at different time points to obtain the gas density values; alternatively, averaging the density values corresponding to N different temperature values collected within the whole temperature range at set time intervals and set temperature interval step length to obtain the gas density values; alternatively, averaging the density values corresponding to N different pressure values collected within the whole pressure change range at set time intervals and set pressure interval step length to obtain the gas density values, wherein N is a positive integer larger than or equal to 1.

Preferably, the intelligent control unit acquires the gas density values collected by the gas density detection sensor when the gas density relay body performs contact signal operating or switching, and online check of the gas density relay is achieved; alternatively, The intelligent control unit acquires the pressure value and temperature value collected by the gas density sensor when the contact signal of the gas density relay body is operated or switched, and converts them into the pressure value corresponding to 20° C. according to the gas pressure-temperature characteristics, that is, the gas density value, and completes the online check of the gas density relay.

Preferably, the gas density relay boy has relative density value output signals which are connected with the intelligent control unit; alternatively, the gas density relay boy has relative pressure value output signals which are connected with the intelligent control unit.

Preferably, based on an embedded algorithm and control program of an embedded system of a microprocessor, the intelligent control unit automatically controls the whole check process, including all peripherals, logic, input and output.

More preferably, based on embedded algorithms and control programs of a general computer, an industrial control computer, an ARM chip, an AI chip, a CPU, an MCU, an FPGA, a PLC, an industrial control main board, an embedded master control board and the like, the intelligent control unit automatically controls the whole check process, including all peripherals, logic, input and output.

Preferably, the intelligent control unit is provided with an electrical interface, which completes test data storage, and/or test data export, and/or test data printing, and/or data communication with an upper computer, and/or analog and digital information input.

More preferably, the gas density relay (or gas density monitoring device) supports input of basic information of the gas density relay, and the basic information includes but is not limited to one or more of factory numbers, precision requirements, rated parameters, manufacturers and operation positions.

Preferably, the intelligent control unit further includes a communication module for remote transmission of test data, and/or check results.

More preferably, the communication mode of the communication module is a wire communication or wireless communication mode.

Further, the wire communication mode includes but is not limited to one or more of an RS232 bus, an RS485 bus, a CAN-BUS bus, 4-20 mA, Hart, IIC, SPI, Wire, a coaxial cable, a PLC and a cable.

Further, the wireless communication mode includes but is not limited to one or more of NB-IOT, 2G/3G/4G/5G, WIFI, Bluetooth, Lora, Lorawan, Zigbee, infrared, ultrasonic waves, acoustic waves, satellites, optical waves, quantum communication and sonar.

Preferably, the intelligent control unit is further provided with a clock, and the clock is configured to regularly set the check time of the gas density relay, or record test time, or record event time.

Preferably, the intelligent control unit performs control through field control, and/or background control.

More preferably, the gas density relay (or gas density monitoring device) completes online check of the gas density relay according to settings or instructions of the background, or according to set check time of the gas density relay.

Preferably, the gas density relay (or gas density monitoring device) further includes a multichannel joint, and the gas density relay body and the temperature regulating mechanism are arranged on the multichannel joint; alternatively, the temperature regulating mechanism is fixed onto the multichannel joint; alternatively, the gas density relay body, the gas density detection sensor and the temperature regulating mechanism are arranged on the multichannel joint.

More preferably, at least two gas density relay bodies, at least two temperature regulating mechanisms, at least two online check contact signal sampling units, one intelligent control unit and one gas density detection sensor complete online check of the gas density relay; alternatively, at least two gas density relay bodies, at least two multichannel joints, at least two temperature regulating mechanisms, at least two online check contact signal sampling units, at least two intelligent control units and one gas density detection sensor complete online check of the gas density relay; alternatively, at least two gas density relay bodies, at least two multichannel joints, at least two temperature regulating mechanisms, at least two online check contact signal sampling units, at least two gas density detection sensors and one intelligent control units complete online check of the gas density relay.

More preferably, the gas density relay (or gas density monitoring device) further includes a first connecting tube, and the gas path of the pressure regulating mechanism is communicated with the gas density relay body through the first connecting tube; a first interface of the multichannel joint is communicated with a part, between the gas density relay body and the pressure regulating mechanism, of the first connecting tube.

More preferably, the valve is communicated with a second interface of the multichannel joint, and communicated with the gas density relay body through the multichannel joint.

More preferably, the interface for communicating the valve with the electrical equipment is communicated with the first interface of the multichannel joint; the gas density relay body is communicated with the multichannel joint through the valve; the second interface of the multichannel joint is used for connecting the electrical equipment.

More preferably, the temperature transducer is communicated with the gas path of the multichannel joint or communicated with a third interface of the multichannel joint.

Preferably, the gas density relay (or gas density monitoring device) further includes a display interface for human-machine interaction, and the display interface is connected with the intelligent control unit, displays current check data in real time, and/or supports data input.

Preferably, the gas density relay (or gas density monitoring device) further includes micro-water sensors, which are respectively connected with the gas density relay body and the intelligent control unit.

More preferably, the gas density relay (or gas density monitoring device) further includes a gas circulation mechanism, which is respectively connected with the gas density relay body and the intelligent control unit and includes a capillary tube, a seal chamber and a heating element.

Further, the micro-water sensors may be mounted in the seal chamber and the capillary tube of the gas circulation mechanism, at an orifice of the capillary tube or outside the capillary tube.

Preferably, the gas density relay (or gas density monitoring device) further includes decomposition sensors, which are respectively connected with the gas density relay body and the intelligent control unit.

Preferably, the gas density relay (or gas density monitoring device) further includes a camera for monitoring.

In the above contents, the gas density relay with the online self-check function generally refers to the composition elements thereof being designed to an integrated structure, and the gas density monitoring device generally refers to the composition elements thereof being designed to a split structure, with flexible composition.

In the second aspect, the present application provides a gas density relay check method, which includes:

in a normal working state, the gas density relay (or gas density monitoring device) monitors the gas density value in the electrical equipment;

The gas density relay (or gas density monitoring device) performs operation according to the set check time and/or check command, the gas density value situation and/or the temperature value situation, under the condition of allowing and/or checking the gas density relay:

The temperature regulating mechanism is controlled via the intelligent control unit, so that the temperature of the gas density relay rises, then the temperature of the temperature compensation element of the gas density relay body rises, so that the gas density relay body takes contact action, and the contact action is transmitted to the intelligent control unit via the online check contact signal sampling unit. The intelligent control unit acquires the gas density value according to the pressure value and the temperature value in the contact action, or acquires the gas density value directly, detects the contact signal operating value of the gas density relay body, and completes the check of the contact signal operating value of the gas density relay;

Upon completion of check of all contact signals, the intelligent control unit shuts off the heating element of the temperature regulating mechanism.

Preferably, the gas density relay check method includes:

In a normal working state, the gas density relay (or gas density monitoring device) monitors the gas density value in the electrical equipment, and at the same time, the gas density relay (or gas density monitoring device) monitors the gas density value in the electrical equipment online via a gas density detection sensor and the intelligent control unit;

The gas density relay (or gas density monitoring device) performs operation according to the set check time and/or check command, the gas density value situation and/or the temperature value situation, under the condition of allowing and/or checking the gas density relay:

The online check contact signal sampling unit is adjusted into a check state via the intelligent control unit. In the check state, the online check contact signal sampling unit cuts off a control loop of the contact signals of the gas density relay body, and contacts of the gas density relay body are connected to the intelligent control unit;

The temperature regulating mechanism is controlled via the intelligent control unit, so that the temperature of the gas density relay rises, then the temperature of the temperature compensation element of the gas density relay body rises, so that the gas density relay body takes contact action, and the contact action is transmitted to the intelligent control unit via the online check contact signal sampling unit. The intelligent control unit acquires the gas density value according to the pressure value and the temperature value in the contact action, or acquires the gas density value directly, detects the contact signal operating value of the gas density relay body, and completes the check of the contact signal operating value of the gas density relay;

The temperature regulating mechanism is controlled via the intelligent control unit, so that the temperature of the gas density relay is reduced, then the temperature of the temperature compensation element of the gas density relay body is reduced, so that contact reset occurs to the gas density relay body, and then the contact reset is transmitted to the intelligent control unit via the online check contact signal sampling unit. The intelligent control unit acquires the gas density value according to the pressure value and the temperature value in the contact reset, or acquires the gas density value directly, detects the contact signal return value of the gas density relay body, and completes the check of the contact signal return value of the gas density relay;

When the check oregulatingcontact signals is completed, the heating element of the temperature regulating mechanism is turned off by the intelligent control unit. The online check contact signal sampling unit is adjusted into a working state. A control loop of the contact signals of the gas density relay is recovered to a normal working state.

Preferably, the gas density relay (or gas density monitoring device) further includes a valve and a pressure regulating mechanism, the gas path of the pressure regulating mechanism is communicated with that of the gas density relay body, a connector communicated with the electrical equipment is arranged at one end of the valve, and the other end of the valve is communicated with the gas path of the gas density relay body; the check method further includes:

in a normal working state, the gas density relay (or gas density monitoring device) monitors the gas density value in the electrical equipment;

The gas density relay (or gas density monitoring device) performs operation according to the set check time and/or check command, the gas density value situation and/or the temperature value situation, under the condition of allowing and/or checking the gas density relay:

The valve is closed via the intelligent control unit;

The pressure regulating mechanism is driven via the intelligent control unit, so that gas pressure falls slowly, then the temperature regulating mechanism is controlled via the intelligent control unit, the temperature of the gas density relay rises, the temperature of the temperature compensation element of the gas density relay body rises, so that the gas density relay body takes contact action, and the contact action is transmitted to the intelligent control unit via the online check contact signal sampling unit. The intelligent control unit acquires the gas density value according to the pressure value and the temperature value in the contact action, or acquires the gas density value directly, detects the contact signal operating value of the gas density relay body, and completes the check of the contact signal operating value of the gas density relay;

When the check of all the contact signals is completed, the intelligent control unit opens the valve and shuts off the heating element of the temperature regulating mechanism.

Preferably, the gas density relay (or gas density monitoring device) further includes a valve and a pressure regulating mechanism, the gas path of the pressure regulating mechanism is communicated with that of the gas density relay body, a connector communicated with the electrical equipment is arranged at one end of the valve, and the other end of the valve is communicated with the gas path of the gas density relay body; the check method further includes:

In a normal working state, the gas density relay (or gas density monitoring device) monitors the gas density value in the electrical equipment, and at the same time, the gas density relay (or gas density monitoring device) monitors the gas density value in the electrical equipment online via a gas density detection sensor and the intelligent control unit;

The gas density relay (or gas density monitoring device) performs operation according to the set check time and/or check command, the gas density value situation and/or the temperature value situation, under the condition of allowing and/or checking the gas density relay:

The valve is closed via the intelligent control unit;

The online check contact signal sampling unit is adjusted into a check state via the intelligent control unit. In the check state, the online check contact signal sampling unit cuts off a control loop of the contact signals of the gas density relay body, and contacts of the gas density relay body are connected to the intelligent control unit;

The temperature regulating mechanism is controlled via the intelligent control unit, so that the temperature of the gas density relay rises, then the temperature of the temperature compensation element of the gas density relay body rises, the pressure regulating mechanism is driven through the intelligent control unit, so that gas pressure falls slowly, the gas density relay body takes contact action, and the contact action is transmitted to the intelligent control unit via the online check contact signal sampling unit. The intelligent control unit acquires the gas density value according to the pressure value and the temperature value in the contact action, or acquires the gas density value directly, detects the contact signal operating value of the gas density relay body, and completes the check of the contact signal operating value of the gas density relay;

The temperature regulating mechanism is controlled via the intelligent control unit, so that the temperature of the gas density relay is reduced, then the temperature of the temperature compensation element of the gas density relay body is reduced, the pressure regulating mechanism is driven via the intelligent control unit, so that gas pressure rises slowly, so that contact reset occurs to the gas density relay body, and then the contact reset is transmitted to the intelligent control unit via the online check contact signal sampling unit. The intelligent control unit acquires the gas density value according to the pressure value and the temperature value in the contact reset, or acquires the gas density value directly, detects the contact signal return value of the gas density relay body, and completes the check of the contact signal return value of the gas density relay.

When the check of all the contact signals is completed, the intelligent control unit opens the valve and shuts off the heating element of the temperature regulating mechanism, the online check contact signal sampling unit is adjusted into a working state, and the control loop of the contact signals of the gas density relay is recovered to a normal working state.

Preferably, the gas density relay (or gas density monitoring device) further includes a heating member and a valve, the heating member is connected with the intelligent control unit, a connector communicated with the electrical equipment is arranged at one end of the valve, and the other end of the valve is communicated with the gas path of the gas density relay body; the check method further includes:

In a normal working state, the gas density relay (or gas density monitoring device) monitors the gas density value in the electrical equipment, and at the same time, the gas density relay (or gas density monitoring device) monitors the gas density value in the electrical equipment online via a gas density detection sensor and the intelligent control unit;

The gas density relay (or gas density monitoring device) performs operation according to the set check time and/or check command, the gas density value situation and/or the temperature value situation, under the condition of allowing and/or checking the gas density relay:

The contact signal sampling unit is adjusted into a check state through the intelligent control unit, the contact signal sampling unit cuts off the control loop of the contact signals of the gas density relay body in the check state, and the contact of the gas density relay body is connected to the intelligent control unit;

Heating of the heating member is controlled by the intelligent control unit, which leads to change in the temperature of gas of the gas density relay body, after the temperature reaches a set value, the valve is closed via the intelligent control unit, and then the heating member is turned off via the intelligent control unit;

After the temperature or pressure of the gas falls properly, the temperature regulating mechanism is controlled via the intelligent control unit, so that the temperature of the gas density relay rises, then the temperature of the temperature compensation element of the gas density relay body rises, so that the gas density relay body takes contact action, the contact action is transmitted to the intelligent control unit via the contact signal sampling unit, the intelligent control unit acquires the gas density value according to the pressure value and the temperature value in the contact action, or acquires the gas density value directly, detects the contact signal operating value of the gas density relay body, and completes the check of the contact signal operating value of the gas density relay;

When the check of all the contact signals is completed, the intelligent control unit opens the valve and shuts off the temperature regulating mechanism.

Preferably, the contact signals include alarm signals and/or blocking signals.

Preferably, the gas density detection sensor includes at least one pressure sensor and at least one temperature transducer; alternatively, the gas density detection sensor is the gas density transmitter comprising the pressure sensors and the temperature transducers; alternatively, the gas density detection sensor is a density detection sensor adopting a quartz tuning fork technology.

Preferably, the gas density relay (or gas density monitoring device) can send an alarm automatically in case of abnormality upon completion of check, and upload the alarm to a far end or send the alarm to a designated receiver.

Preferably, the check method further includes: displaying gas density values and check results in field or displaying the gas density values and the check results through the background.

Preferably, the check method further includes: the intelligent control unit performs control through field control, and/or background control.

The third aspect of the application provides a method for reforming a gas density relay, comprising:

The gas density detection sensor is communicated with the gas density relay body;

The gas path of the gas density detection sensor is connected with a first connector of the multichannel joint;

The temperature regulating mechanism is arranged inside or outside the housing of the gas density relay body and regulates temperature rise and fall of the temperature compensation element of the gas density relay body, so that the gas density relay body takes contact signal action;

The online check contact signal sampling unit is directly or indirectly connected with the gas density relay body and samples contact signals generated when the contacts of the gas density relay body take action;

The intelligent control unit is respectively connected with the gas density detection sensor, the temperature regulating mechanism and the online check contact signal sampling unit and configured to complete control of the temperature regulating mechanism, pressure value acquisition, temperature value acquisition and/or gas density value acquisition and detect contact signal operating values and/or contact signal return values of the gas density relay body;

The contact signals include alarm signals and/or blocking signals.

Preferably, the gas density detection sensor, the online check contact signal sampling unit and the intelligent control unit are arranged on the gas density relay body; alternatively, the temperature regulating mechanism is arranged on the gas density relay body; alternatively, the temperature regulating mechanism is arranged in the gas density relay body; alternatively, the gas density detection sensor, the temperature regulating mechanism, the online check contact signal sampling unit and the intelligent control unit are arranged on the gas density relay body; alternatively, the multichannel joint is arranged on the gas density relay body; alternatively, the temperature regulating mechanism is fixed onto the multichannel joint; alternatively, the temperature regulating mechanism and the gas density detection sensor are arranged on the multichannel joint; alternatively, the online check contact signal sampling unit and the intelligent control unit are arranged on the multichannel joint.

Preferably, the gas density relay modification method further includes: one end of the valve is communicated with the electrical equipment, and the other end of the valve is communicated with the gas path of the gas density relay body.

More preferably, the valve is further connected with the intelligent control unit, so that the valve is closed or opened under the control of the intelligent control unit.

More preferably, the gas density relay modification method further includes: the self-sealing valve is mounted between the multichannel joint and the valve; alternatively, the valve is mounted between the multichannel joint and the self-sealing valve.

Preferably, the gas density relay modification method further includes: the gas path of the pressure regulating mechanism is communicated with the gas density relay body; the pressure regulating mechanism is configured to regulate pressure rise and fall of the gas density relay body to be matched and/or combined with the temperature regulating mechanism, so that the gas density relay body takes contact signal action; the pressure regulating mechanism is further connected with the intelligent control unit, so that the pressure regulating mechanism works under the control of the intelligent control unit; alternatively, the gas density relay modification method further includes: the intelligent control unit is connected with the heating member; alternatively, the gas density relay modification method further includes: the air chamber is communicated with the gas density relay body, the heating member is arranged outside or inside the air chamber, and the intelligent control unit is connected with the heating member.

More preferably, the gas density relay modification method further includes: an air admission interface is formed in the pressure regulating mechanism; alternatively, the air admission interface is formed in the electrical equipment monitored by the gas density relay; alternatively, the air admission interface is formed in the multichannel joint; alternatively, the air admission interface is formed in the gas density relay body.

Compared with the prior art, the technical scheme of the invention has the following advantages:

The present application provides a gas density relay with an online self-check function and a check method thereof, wherein the gas density relay is used for high-voltage and medium-voltage electrical equipment. The gas density relay includes a gas density relay body, a gas density detection sensor, a temperature regulating mechanism, an online check contact signal sampling unit and an intelligent control unit. Temperature rise and fall of a temperature compensation element of the gas density relay is regulated through the temperature regulating mechanism, so that the gas density relay body takes contact action, the contact action is transmitted to the intelligent control unit through the online check contact signal sampling unit, the intelligent control unit detects alarm and/or blocking contact signal operating values and/or return values of the gas density relay body according to density values in the contact action, check of the gas density relay can be completed without additional installation of a density relay check connector and without maintainers on site, the reliability of a power grid and working efficiency are improved, and cost is reduced. Meanwhile, mutual self-check between the gas density relay body and the gas density detection sensor may be achieved through the intelligent control unit, and the gas density relay with the online self-check function is free from maintenance.

BRIEF DESCRIPTION OF THE DRAWINGS

Drawings for constituting a part of the present application are used to provide further understanding of the present application, and exemplary embodiments of the present application and descriptions thereof are used to explain the present application, and do not constitute improper limitation to the present application. In the drawings.

DETAILED DESCRIPTION OF THE EMBODIMENTS

In order to make the purpose, the technical scheme and the advantages of the invention more clear and definite, the invention is further elaborated hereafter with reference to the drawings and examples. It should be understood that the specific embodiments described herein are only used to explain the invention, and cannot play a role in limiting the invention.

Embodiment I

Figure 1:
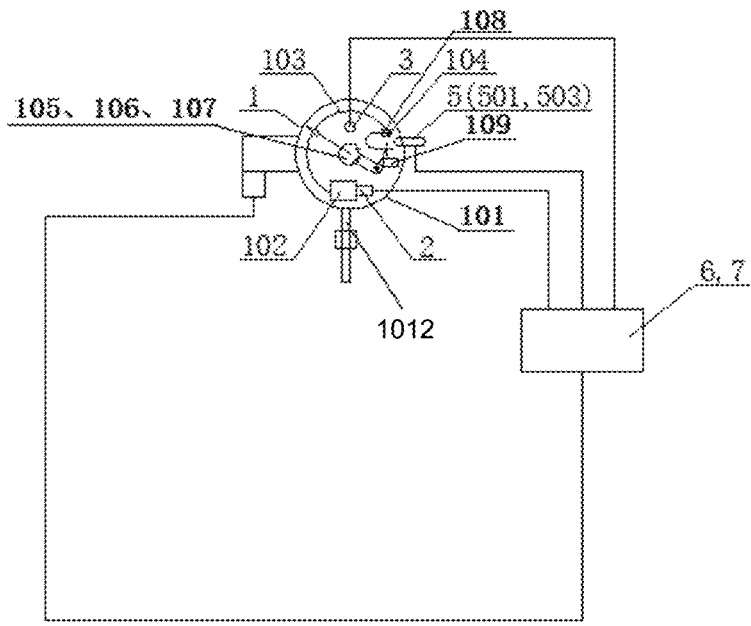
FIG. 1 is a structural schematic diagram of a gas density relay with an online self-check function in an embodiment I.

FIG. 1 is a structural schematic diagram of a gas density relay with an online self-check function for high-voltage and medium-voltage electrical equipment in an embodiment I. As shown in FIG. 1, the gas density relay with the online self-check function includes a gas density relay body 1, and the gas density relay body 1 includes a housing 101, and a base 102, an end seat 108, a pressure detector 103, a temperature compensation element 104, a plurality of signal generators 109, a movement 105, a pointer 106 and a dial 107 which are arranged in the housing 101. One end of the pressure detector 103 is fixed onto the base 102 and communicated with the same, the other end of the pressure detector 103 is connected with one end of the temperature compensation element 104 through the end seat 108, a beam is arranged at the other end of the temperature compensation element 104, and a regulating part for pushing the signal generators 109 is arranged on the beam, so that contacts 1091 of the signal generators 109 (see FIGS. 3 and 4) are connected or disconnected. The movement 105 is fixed onto the base 102; the other end of the temperature compensation element 104 is connected with the movement 105 through a connecting rod or directly connected with the movement 105; the pointer 106 is mounted on the movement 105 and arranged in the front of the dial 107, and the pointer 106 and the dial 107 display gas density values. The gas density relay body 1 may further include a digital device or liquid crystal device with an indicating value display function.

Besides, the gas density relay further includes a pressure sensor 2, a temperature transducer 3, a temperature regulating mechanism 5, an online check contact signal sampling unit 6 and an intelligent control unit 7. The pressure sensor 2 is communicated with the pressure detector 103 on the gas path 1012; the temperature regulating mechanism 5 is arranged in the housing 101 (on the housing 101); the online check contact signal sampling unit 6 is respectively connected with the signal generators 109 and the intelligent control unit 7; the temperature transducer 3 is arranged in the housing 101; the pressure sensor 2, the temperature transducer 3 and the temperature regulating mechanism 5 are respectively connected with the intelligent control unit 7. The temperature regulating mechanism 5 mainly includes a heating element 501 and a temperature regulating mechanism outer shell 503.

Each signal generator 109 includes a microswitch or a magnetic assisted electrical contact, and the gas density relay body 1 outputs contact signals through the signal generators 109; the pressure detector 103 includes a Bourdon tube or bellow; the temperature compensation element 104 adopts a temperature compensation piece or gas sealed in the housing. The gas density relay of the present application may further include: an oil-filled density relay, an oil-free density relay, a gas density meter, a gas density switch or a gas pressure meter.

In the gas density relay of the embodiment, changed pressure incluerature are corrected via the temperature compensation element 104 based on the pressure detector 103, so as to reflect the change of sulfur hexafluoride gas density. Namely, under the pressure action of sulfur hexafluoride (SF6) as a measured medium, owing to the action of the temperature compensation element 104, when the gas density value of sulfur hexafluoride changes, the pressure value of the sulfur hexafluoride gas correspondingly changes to force the tail end of the pressure detector 103 to generate corresponding elastic deformation displacement, which is transmitted to the movement 105 via the temperature compensation element 104 and then transmitted to the pointer 106 via the movement 105, so that the gas density value of the measured sulfur hexafluoride is indicated on the dial 107. The signal generators 109 serve as output alarm blocking contacts. Therefore, the gas density relay body 1 can display the gas density value of the sulfur hexafluoride. In case of gas leakage and reduction of the gas density value of the sulfur hexafluoride, the pressure detector 103 generates regulatinging downward displacement, which is transmitted to the movement 105 via the temperature compensation element 104 and then transmitted to the pointer 106 via the movement 105, the pointer 106 moves towards small indicating values, and the degree of gas leakage is displayed on the dial 107 specifically; at the same time, the pressure detector 103 drives the beam to displace downwards via the temperature compensation element 104, a regulating part on the beam drifts away from the signal generators 109 to a certain degree, contacts 1091 of the signal generators 109 (see FIGS. 3 and 4) are connected to transmit corresponding contact signals (alarm or blocking) and accordingly monitor and control the gas density of the sulfur hexafluoride in the equipment such as an electrical switch, and then the electrical equipment can work safely.

If the gas density value rises, namely, when the pressure value of the sulfur hexafluoride gas in the sealed air chamber is higher than the set pressure value of the sulfur hexafluoride gas, the pressure value rises correspondingly, the tail end of the pressure detector 103 and the temperature compensation element 104 displace upwards correspondingly, the temperature compensation element 104 enables the beam to displace upwards, the regulating part on the beam displaces upwards and pushes the contacts of the signal generator 109 to be disconnected, and the contact signals (alarm or blocking) are removed.

The temperature regulating mechanism 5 is a heating element; or the temperature regulating mechanism is mainly composed of the heating element, a heat insulation element, a temperature controller, a temperature detector, a temperature regulating mechanism outer shell and the like; or the temperature regulating mechanism mainly consists of the heating element and the temperature controller; or the temperature regulating mechanism is mainly composed of the heating element, a heating power regulator and the temperature controller; or the temperature regulating mechanism is mainly composed of the heating element, a refrigeration element, the heating power regulator and the temperature controller; or the temperature regulating mechanism is mainly composed of the heating element, the heating power regulator and a thermostatic controller; or the temperature regulating mechanism is mainly composed of the heating element, the temperature controller, the temperature detector and the like; or the temperature regulating mechanism is the heating element, which is arranged around a temperature compensation element; or the temperature regulating mechanism is a miniature constant temperature box, wherein the heating element includes but is not limited to one of a silicone rubber heater, a resistance wire, an electric heating tape, an electric heating rod, a hot gas fan, an infrared ray heating element and a semiconductor; and the temperature controller includes but is not limited to one of a PID controller, a controller combining PID with fuzzy control, an inverter controller and a PLC controller.

The type of the pressure sensor 2 may be an absolute pressure sensor, a relative pressure sensor, or the absolute pressure sensor or the relative pressure sensor, and there may be a plurality of the absolute pressure sensors or the relative pressure sensors. The form of the pressure sensor may be a diffusion silicon pressure sensor, a MEMS pressure sensor, a chip pressure sensor, a coil induction pressure sensor (such as a pressure measuring sensor of an induction coil on a Bourdon tube), a resistance pressure sensor (such as the pressure measuring sensor of slide wire resistance on the Bourdon tube), an analog pressure sensor and a digital pressure sensor. The pressure is collected via the pressure sensor, the pressure transmitter and various pressure sensing elements, such as the diffusion silicon type, sapphire type, piezoelectric type and strain gauge type (resistance strain gauge type and ceramic strain gauge type).

The temperature transducer 3 may be thermocouple, thermistor, optical fiber, semiconductor, or contact and non-contact, or thermal resistance and thermocouple; or digital and analog, such as DS18B20, PT100. In short, the temperature transducer, the temperature transmitter and various temperature sensing elements can be used for the temperature collection.

The online check contact signal sampling unit 6 mainly completes the contact signal sampling of the gas density relay body 1. Namely, the basic requirements or functions of the online check contact signal sampling unit 6 are as follows: 1) The safe operation of the electrical equipment is not affected during check, that is, the safe operation of the electrical equipment is not affected when the contact signal of the gas density relay body 1 acts during check; 2) The contact signal control loop of the gas density relay body 1 does not affect the performance of the gas density relay, especially the performance of the intelligent control unit 7, not damage the gas density relay or affect the test work.

The basic requirements or functions of the intelligent control unit 7 are as follows: the control and signal collection of the temperature regulating mechanism 5 (even the pressure regulating mechanism 11) are completed via the intelligent control unit 7. Realize: when the contact signal of the gas density relay body 1 acts, the pressure value and the temperature value can be detected, then converted into the corresponding pressure value $P_{20}$ (density value) at 20° C., that is, the contact operating value $P_{D20}$ of the gas density relay body 1 can be detected, so as to complete the check of the gas density relay body 1. Alternatively, it can directly detect the density value $P_{D20}$ when the contact signal of the gas density relay body 1 acts, and complete the check of the gas density relay body 1. at the same time, the self-check of the gas density relay body 1, the pressure sensor 2 and the temperature transducer 3 may be completed via testing the rated pressure value of the gas density relay body 1, so as to realize free maintenance.

Of course, the intelligent control unit 7 can also realize: storing test data; and/or exporting the test data; and/or printing the test data; and/or data communication with an upper computer; and/or inputting analog and digital information. The intelligent control unit 7 may also include a communication module, through which the remote transmission of the test data and/or the check results and other information can be realized; when the rated pressure value of the gas density relay body 1 outputs a signal, the intelligent control unit 7 collects the density value at the that time to complete the check of the rated pressure value of the gas density relay body 1.

The electrical equipment includes SF6 gas electrical equipment, SF6 mixed gas electrical equipment, environmental protection gas electrical equipment, or other insulating gas electrical equipment. Specifically, the electrical equipment includes GIS, GIL, PASS, a circuit breaker, a current transformer, a voltage transformer, a transformer, an inflatable cabinet and a ring main unit, etc.

The gas density relay body 1, the pressure sensor 2, the temperature transducer 3, the temperature regulating mechanism 5, the online check contact signal sampling unit 6 and the intelligent control unit 7 can be flexibly arranged according to the needs. For example, the gas density relay body 1, the pressure sensor 2 and the temperature transducer 3 can be arranged together; or the gas density relay body 1 and the pressure regulating mechanism 5 can be arranged together; and in short, they can be flexibly arranged and combined.

In this embodiment, the check and monitoring principles of the gas density relay with the online check function are as follows:

The intelligent control unit 7 monitors the gas pressure P and temperature T of the electrical equipment with pressure sensor 2 and temperature transducer 3, and obtains the pressure value $P_{20}$ (i.e. gas density value) under the corresponding temperature of 20° C. When the gas relay 1 is required and/or may be checked, at this time, if the gas density value $P_{20}$ is greater than or equal to the setting safety check density value $P_s$, the gas density relay may send out a command, this is, the control loop of the gas density relay body 1 is disconnected via the intelligent control unit 7, so that the safe operation of the electrical equipment is not affected during the online check of the gas density relay body 1, and an alarm signal is not sent by mistake, or the control loop is locked during the check. Before verifying the gas density relay, it has monitored and judged that the gas density value $P_{20}$ is greater than or equal to the setting safety check density value, the gas of the electrical equipment is the range of the safe operation, in addition, the gas leakage is a slow process, so the electrical equipment is safe during check. At the same time, the intelligent control unit 7 is communicated with the contact sampling circuit of the gas density relay body 1, then the intelligent control unit 7 operates or controls the temperature regulating mechanism 5, so that the temperature of the gas density relay rises, then the temperature of the temperature compensation element of the gas density relay body 1 rises. When the temperature closes to the operating value, the temperature change speed is not greater than 1.0° C./s (even not greater than 0.5° C./s, or this requirement is set according to the needs), namely, the temperature is required to rise or fall stably. Until a contact action occurs to the gas density relay body 1, the contact action is delivered to the intelligent control unit 7 via the online check contact signal sampling unit 6. The intelligent control unit 7 obtains the gas density value according to the pressure value and temperature value when the contact acts, or obtains the gas density value directly, detects the contact signal operating value of the gas density relay, and completes the check of the contact signal operating value of the gas density relay. For example, for the gas density relay with the density relay parameter of 0.6/0.52/0.50 MPa (the related value is 0.6 MPa/the alarm pressure value is 0.52 MPa/the alarm pressure value is 0.50 MPa, relative pressure), when the environment temperature is 5° C., the gas pressure of the gas chamber of the electrical equipment is 0.5562 MPa (relative pressure), the pressure value is unchanged in the check system at this time. When the temperature rises to 29.5° C., the alarm contact sends out an action, the intelligent control unit 7 can obtain the alarm contact operating value 0.5317 MPa (relative pressure) of the gas density value according to the pressure value 0.5562 MPa (relative pressure) and the temperature value 29.5° C. when the contact acts, then the intelligent control unit 7 can obtain the error of the alarm contact operating value: 0.0117 MPa (0.5317 MPa-0.52 MPa=0.0117 MPa), so as to complete the check of the alarm contact operating value of the gas density relay.

The temperature regulating mechanism 5 is controlled and operated via the intelligent control unit 7, so that the temperature of the gas density relay is reduced, then the temperature of the temperature compensation element of the gas density relay body 1 is reduced, so that a contact reset occurs to the gas density relay body 1, then the contact reset is delivered to the intelligent control unit 7 via the online check contact signal sampling unit 6. The intelligent control unit 7 obtains the gas density value according to the pressure value and the temperature value when the contact resets, or obtains the gas density value directly, detects the contact signal return value of the gas density relay body 1, and completes the check of the contact signal return value of the gas density relay. For example, for the gas density relay with the density relay parameter of 0.6/0.52/0.50 MPa (the related value is 0.6 MPa/the alarm pressure value is 0.52 MPa/the alarm pressure value is 0.50 MPa, relative pressure), when the environment temperature is 5° C., the gas pressure in the electrical equipment is 0.5562 MPa (relative pressure), the pressure value is unchanged in the check system at this time. When the temperature falls to 24.8° C., a contact reset occurs to the alarm contact, the intelligent control unit 7 can obtain the alarm contact return value 0.5435 MPa (relative pressure) of the gas density value according to the pressure value 0.5562 MPa (relative pressure) and the temperature value 24.8° C. when the contact resets, then the intelligent control unit 7 can obtain the switching error of the alarm contact: 0.0118 MPa (0.5435 MPa-0.5317 MPa=0.0118 MPa), thus the check of the alarm contact operating value of the gas density relay is basically completed. According to the requirements and the check results (check data), the intelligent control unit 7 can judge the performance of the checked gas density relay (qualified or unqualified). After verifying for many times (such as 2-3 times), the average value is calculated, thus the check of the gas density relay body 1 is completed. And then the intelligent control unit 7 disconnects the contact sampling circuit of the gas density relay body 1, at this time, the contact of the gas density relay body 1 is not connected to the intelligent control unit 7. At the same time, the heating element of the temperature regulating mechanism is turned off via the intelligent control unit 7, the online check contact signal sampling unit 6 is adjusted to the working state, and the control loop of the contact signal of the gas density relay body 1 recovers to the normal working state. Namely, the control loop of the gas density relay body 1 is communicated via the intelligent control unit 7, the density monitoring loop of the gas density relay body works normally, and the gas density relay body 1 monitors the gas density of the electrical equipment safely, so that the electrical equipment works safely and reliably. Thus, the online check of the gas density relay body 1 is conveniently completed, at the same time, the safe operation of the electrical equipment is not affected during the online check of the gas density relay body 1.

When the gas density relay body 1 completes the check, the gas density relay (or the gas density monitoring device) performs judgment and informs the testing result, and the way is flexible. Specifically: 1) the gas density relay (or the gas density monitoring device) can be notified locally, for example, be displayed via an indicator light, a digital display, or a liquid crystal display; 2) or be uploaded via an online remote communication, for example, uploaded to a background of the online monitoring system; 3) or be uploaded wirelessly to a specific terminal, for example, be uploaded wirelessly to a mobile phone; 4) or be uploaded via other channels; 5) or upload an abnormal result via an alarm signal wire, or a special signal wire; 6) or upload the abnormal result separately, or upload the abnormal result bundled with other signals. In short, after the gas density relay (or the gas density monitoring device) completes the online check of the gas density relay, if an abnormality is provided, the electrical system can automatically send an alarm, can upload the abnormality to a distal end, or can send the abnormality to a designated receiver, such as the mobile phone. Or, after the gas density relay body (or the gas density monitoring device) completes the check, if an abnormality is provided, the intelligent control unit 7 can be uploaded to a distal end (monitoring room, background monitoring platform, etc.) via the alarm contact signal of the gas density relay body 1, and the notice may be locally displayed. For the online check of the simple gas density relay, the abnormal check result can be uploaded via the alarm signal line. The abnormal check result can be uploaded regularly. If an abnormality is provided, a contact is connected to the alarm signal contact in parallel to be closed and disconnected regularly, and the condition can be obtained via analysis; or abnormal check result is uploaded by the independent check signal line. Specifically, the upload may be performed for the good state or the problem, or the check result is uploaded via the separate check signal line, or locally displayed, locally alarmed, uploaded wirelessly, or uploaded in networking with a smartphone. The communication way is wire or wireless, the wire communication way may be RS232, RS485, CAN-BUS and other industrial buses, optical fiber ethernet, 4-20 mA, Hart, IIC, SPI, Wire, a coaxial cable, an PLC power line carrier, etc. The wireless communication way may be 2G/3G/4G/5G, WIFI, Bluetooth, Lora, Lorawan, Zigbee, infrared, ultrasonic, acoustic, satellite, light wave, quantum communication, sonar, a sensor built-in 5G/NB-iot communication module (such as NB-iot), etc. In short, it may be multiple ways and a plurality of combinations, to ensure the reliable performance of the gas density relay completely.

The gas density relay has the function of safety protection, that is, when lower than the setting value, the gas density relay automatically stops the online check of the density relay and sends out a notice signal For example, when the gas density value of the equipment is less than the setting value PS, the check stops, only when the gas density value of the equipment is greater than or equal to (the alarm pressure value+0.02 MPa), the online check can be performed.

The gas density relay can perform the online check according to the setting time, or perform the online check according to the setting temperature (such as extreme high temperature, high temperature, extreme low temperature, low temperature, normal temperature, 20° C., etc.). The error judgment requirements are different for online check at high temperature, low temperature, normal temperature and 20° C. ambient temperature. For example, for check at 20° C. ambient temperature, the accuracy requirements of gas density relay can be level 1.0 or 1.6, or level 2.5 at high temperature. Specifically, it can be implemented according to the temperature requirements and the related standards. For example, according to the regulations of the temperature compensation performance in article 4.8 of DL/T 259 Calibration Regulation for SF6 Gas Density Monitor, and the precision requirement corresponding to each temperature value.

The gas density relay can compare its error performance in different time periods under different temperatures, namely, compare in the same temperature range of different periods, to judge the performance of the gas density relay and the electrical equipment. Specifically, comparison of various periods and comparison of history and present.

The gas density relay can be verified for many times (such as 2-3 times), and the average value is calculated according to each check result. If necessary, online check may be carried out to the gas density relay at any time.

At the same time, the gas density relay may also monitor the gas density value of the electrical equipment online, and/or pressure value, and/or temperature value, and upload to the target equipment to realize online monitoring.

Embodiment II

Figure 2:
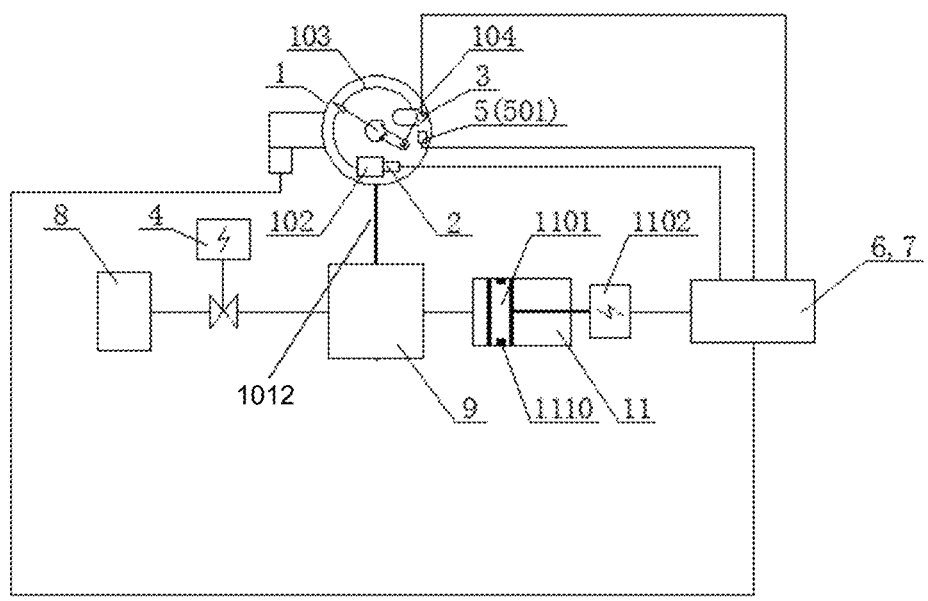
FIG. 2 is a structural schematic diagram of a gas density relay with an online self-check function in an embodiment II.

As shown in FIG. 2, the embodiment II of the present disclosure provides a gas density relay with an online self-check function or a gas density monitoring device, the gas density relay includes a gas density relay body 1, a pressure sensor 2, a temperature transducer 3, a temperature regulating mechanism 5, an online check contact signal sampling unit 6, an intelligent control unit 7, a multichannel joint 9 and a pressure regulating mechanism 11. One end of the valve 4 is hermetically connected to the electrical equipment 8, and the other end of the valve 4 is connected to the multichannel joint 9. The gas density relay body 1 is installed on the multichannel joint 9. The pressure sensor 2 and the temperature transducer 3 are arranged on the gas density relay body 1, and the pressure sensor 2 is communicated with the gas density relay body 1 on a gas path 1012. The temperature regulating mechanism 5 is mainly composed of a heating element 501 and controlled via by the intelligent control unit 7, namely, a controller of the heating element 501 and the intelligent control unit 7 are arranged or designed together. The pressure regulating mechanism 11 is installed on the multichannel joint 9 and communicated with the gas path 1012 of the gas density relay body 1. The online check contact signal sampling unit 6, the pressure sensor 2, the temperature transducer 3, the valve 4, the temperature regulating mechanism 5 and the pressure regulating mechanism 11 are respectively connected to the intelligent control unit 7.

Different from the embodiment I, this embodiment further includes the valve 4 and the pressure regulating mechanism 11. The pressure regulating mechanism 11 includes a piston 1101, a drive mechanism 1102 and a sealing ring 1110. The piston 1101 is driven to move in the pressure regulating mechanism via the drive mechanism 1102, and then the pressure rising and falling can be completed.

The working principle is as follows: the online check contact signal sampling unit 6 is adjusted to the check state via by the intelligent control unit 7. Under the check state, the online check contact signal sampling unit 6 cuts off the control loop of the contact signal of the gas density relay body 1, so that the contact of the gas density relay body 1 is connected to the intelligent control unit 7. The valve between the gas density relay body 1 and the electrical equipment 8 is closed via the intelligent control unit 7. The pressure regulating mechanism 11 is driven by the intelligent control unit 7, so that the pressure of the gas density relay falls slowly, and after falling to the target pressure value, this operation can stop. Then, the temperature regulating mechanism 5 is controlled and operated via the intelligent control unit 7, so that the temperature of the gas density relay body 1 rises, then the temperature of the temperature compensation element of the gas density relay body 1 rises, so that a contact action occurs to the gas density relay body 1, and the contact action is delivered to the intelligent control unit 7 via the online check contact signal sampling unit 6. The intelligent control unit 7 obtains the gas density value according to the pressure value and the temperature value when the contact acts, or obtains the gas density value directly, detects the contact signal operating value of the gas density relay, and completes the check of the contact signal operating value of the gas density relay, and this operation is similar to the embodiment I.

The temperature regulating mechanism 5 is controlled and operated via the intelligent control unit 7, so that the temperature of the gas density relay body 1 is reduced, then the temperature of the compensating element of the gas density relay body 1 is reduced, so that a contact reset occurs to the gas density relay, then the contact reset is delivered to the intelligent control unit 7 via the online check contact signal sampling unit 6. The intelligent control unit 7 obtains the gas density value according to the pressure value and the temperature value when the contact resets, or obtains the gas density value directly, detects the contact signal return value of the gas density relay body 1, and completes the check of the contact signal return value of the gas density relay.

When the check of all contact signals is completed, the heating element of the temperature regulating mechanism 5 is turned off via the intelligent control unit 7, the online check contact signal sampling unit 6 is adjusted to the working state, and the control loop of the contact signal of the gas density relay body 1 recovers to the normal working state. In this embodiment, the operation sequence of the temperature regulating mechanism 5 and the pressure regulating mechanism 11 is flexible, namely, the pressure regulating mechanism 11 can be operated first, then the temperature regulating mechanism 5 is operated; or the temperature regulating mechanism 5 can be operated first, then the pressure regulating mechanism 11 is operated; or the pressure regulating mechanism 11 and the temperature regulating mechanism 5 can be operated at the same time.

Embodiment III

Figure 3:
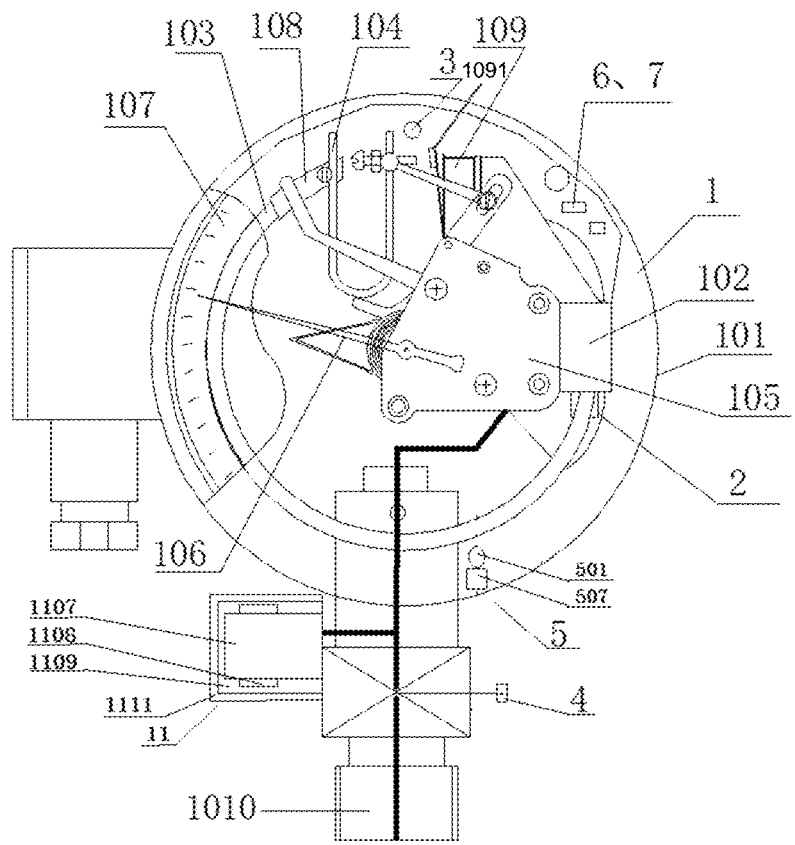
FIG. 3 is a structural schematic diagram of a gas density relay with an online self-check function in an embodiment III.

As shown in FIG. 3, the embodiment III of the present disclosure provides a gas density relay with an online self-check function or a gas density monitoring device, and the temperature regulating mechanism 5 is mainly composed of a heating element 501 and (insulation) a fixed base 507, which are arranged in the housing 101 (or on the housing 101) of the gas density relay body 1. Different from the embodiment II, the pressure regulating mechanism 11 in this embodiment is regulated via heating or cooling ways. Specifically, the pressure regulating mechanism 11 is mainly composed of a gas chamber 1107, a heating element 1108 (and/or a refrigeration element), a heat insulation element 1109 and a housing 1111. The heating element 1108 (and/or the refrigeration element) is arranged outside or inside the gas chamber 1107, the temperature of the gas in the gas chamber 1107 is changed due to heating the heating element 1107 (and/or refrigerating the refrigeration element), then the pressure rising and falling of the gas density relay body 1 can be completed.

Embodiment IV

Figure 4:
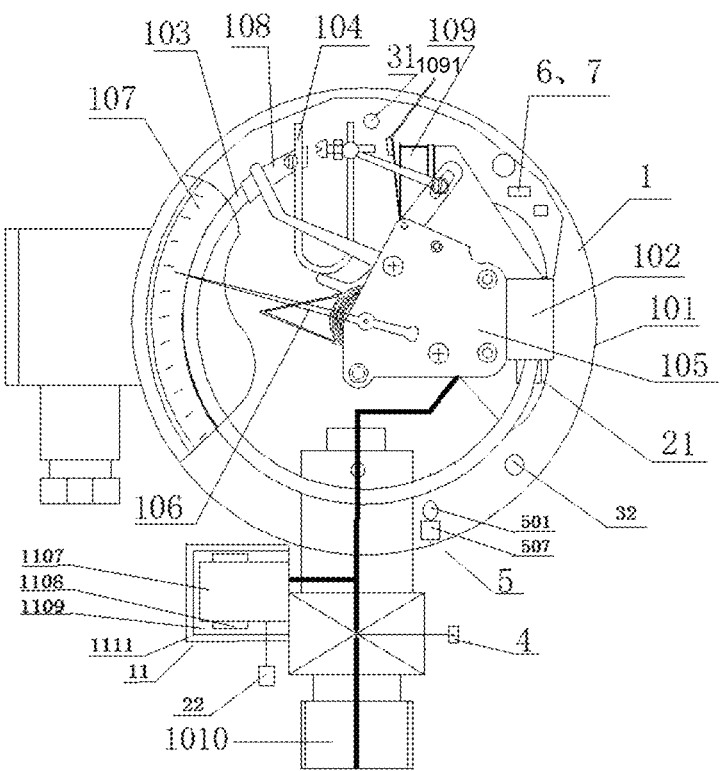
FIG. 4 is a structural schematic diagram of a gas density relay with an online self-check function in an embodiment IV.

As shown in FIG. 4, the embodiment IV of the present disclosure provides a gas density relay with an online self-check function or a gas density monitoring device. The gas density relay includes a gas density relay body 1, a first pressure sensor 21, a second pressure sensor 22, a first temperature transducer 31, a second temperature transducer 32, a temperature regulating mechanism 5, an online check contact signal sampling unit 6, an intelligent control unit 7, a multichannel joint 9, an air admission interface 10 and a self-sealing valve 11. One end of the self-sealing valve is hermetically connected to the electrical equipment, and the other end of the self-sealing valve is connected to the multichannel joint 9. The gas density relay body 1, the second pressure sensor 22, the second temperature transducer 32, the temperature regulating mechanism 5 and the air admission interface 10 arranged on the multichannel joint 9, and the first pressure sensor 21 and the first temperature transducer 31 are arranged on the gas density relay body 1. The second pressure sensor 21, the second temperature transducer 22, the first temperature transducer 31 and the second temperature transducer 32 are respectively connected to the intelligent control unit 7. The first pressure sensor 21, the second pressure sensor 22 and the gas density relay body 1 are communicated with each other on the gas path.

Different from the embodiment I, there are two pressure sensors, which are the first pressure sensor 21 and the second pressure sensor 22, and there are two temperature transducers, which are the first temperature transducer 31 and the second temperature transducer 32 The embodiment provides a plurality of pressure sensors and temperature transducers for the following purpose: the pressure values obtained by monitoring the first pressure sensor 21 and the second pressure sensor 22 may be compared and mutually checked. The temperature values obtained by monitoring the first temperature transducer 31 and the second temperature transducer 32 may be compared and mutually checked. The density value $P1_{20}$ obtained by monitoring the first pressure sensor 21 and the first temperature transducer 31 is compared with the density value $P2_{20}$ obtained by monitoring the second pressure sensor 22 and the second temperature transducer 32 and checked mutually. Even the density value $Pe_{20}$ of the rated value of the gas density relay body 1 may be obtained through online check, and mutual comparison and mutual check are performed.

The technology provided by the present disclosure has the function of safety protection, specifically: 1) when the density value obtained by monitoring the first pressure sensor 21 and the first temperature transducer 31 or the second pressure sensor 22 and the second temperature transducer 32 is lower than the setting value, the gas density relay does not check the gas density relay body 1 automatically, and sends out a notice signal. For example, when the gas density value of the equipment is less than the setting value, the check stops, only when the gas density value of the equipment is greater than or equal to (the blocking pressure+0.02 MPa), the check can be performed. A state indicator is provided for the contact alarm. 2) Or during the check, the valve 4 is closed at this time, when the density value obtained by monitoring the second pressure sensor 22 and the second temperature transducer 32 is lower than the setting value, the gas density relay does not check the gas density relay body 1 automatically, and sends out a notice signal (air leakage). For example, when the gas density value of the equipment is less than the setting value (the blocking pressure+0.02 MPa), the check stops, and the setting value can be arbitrarily set according to the demands. At the same time, the gas density relay can perform the mutual check for the plurality of pressure sensors and the temperature transducers and the mutual check for the sensors and the gas density relay, to ensure the normal work of the gas density relay.

Embodiment V

Figure 5:
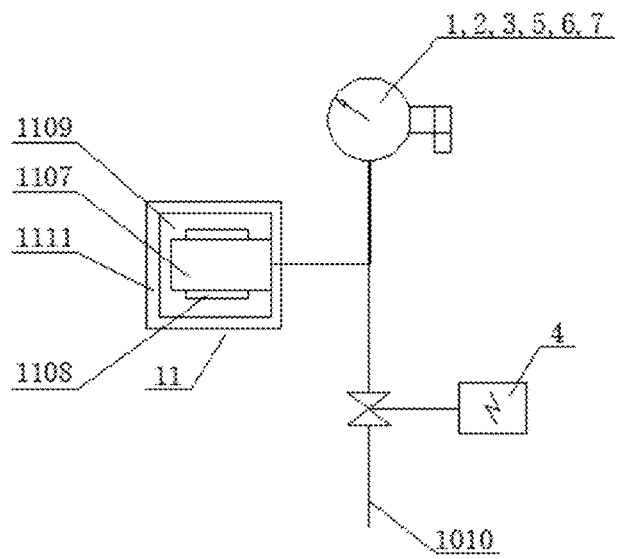
FIG. 5 is a structural schematic diagram of a gas density relay with an online self-check function in an embodiment V.

As shown in FIG. 5, the embodiment V of the present disclosure provides a gas density relay with an online self-check function or a gas density monitoring device. Different from the embodiment III, in this embodiment, the position of the pressure regulating mechanism 11 is different from that of the valve 4, and the gas density relay body 1, the pressure sensor 2, the temperature transducer 3, the temperature regulating mechanism 5, the online check contact signal sampling unit 6 and the intelligent control unit 7 are arranged together. The arrangement may be flexibly designed according to the demands.

Embodiment VI

Figure 6:
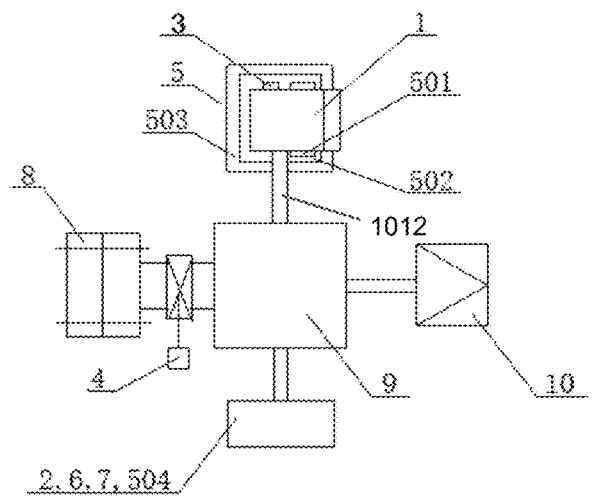
FIG. 6 is a structural schematic diagram of a gas density relay with an online self-check function in an embodiment VI.

As shown in FIG. 6, the embodiment VI of the present disclosure provides a gas density relay with an online self-check function or a gas density monitoring device. Different from the embodiment I, this embodiment further includes a valve 4 and a multichannel joint 9, one end of the valve 4 is communicated with the electrical equipment 8 while the other end is communicated with the gas path 1012 of the gas density relay body 1 through the multichannel joint 9, the valve 4 is connected to the intelligent control unit 7, and the pressure sensor 2, the online check contact signal sampling unit 6 and the intelligent control unit 7 are arranged together on the multichannel joint 9. The temperature regulating mechanism 5 is mainly composed of the heating element 501, the heat insulation element 502, the temperature controller 504, the temperature detector 3 (the same as the temperature transducer) and the temperature regulating mechanism outer shell 503. The temperature controller 504 may adopt PID control or the control way combining the PID and the fuzzy control. The range of the electric heating work power of the heating element 501 is controlled by the temperature controller 504 and the setting value of the temperature rise and fall amplitude, and the change amplitude of the temperature is controlled via the different power. A degree of deviation may be set, so as to heat or refrigerate in advance. When measuring the gas density relay contact signal operating value and closing to the operating value, the change speed of the temperature in the temperature regulating mechanism 5 is not greater than 1.0° C./s (even not greater than 0.5° C./s, or set this requirement according to the demands), that is, the temperature is required to rise or fall stably.

The working principle is as follows: under the condition of allowing and/or checking the gas density relay, for example, the winter can be selected and when the gas pressure of the electrical equipment is lower, the online check contact signal sampling unit 6 is adjusted to the check state via the intelligent control unit 7 according to the setting check time, the gas density value situation and/or the temperature value situation. Under the check state, the online check contact signal sampling unit 6 cuts off the control loop of the contact signal of the gas density relay body 1, so that the contact of the gas density relay body 1 is connected to the intelligent control unit 7. The temperature regulating mechanism 5 is controlled via the intelligent control unit 7, so that the gas temperature of the gas density relay rises, after rising to the setting value (for example, the setting value temperature is 70° C.), the valve 4 is closed via the intelligent control unit 7. After the gas temperature or pressure of the gas density relay falls to a suitable value (for example, the ambient temperature is 12° C.), the temperature regulating mechanism 5 is controlled again via the intelligent control unit 7, so that the temperature of the gas density relay rises, then the temperature of the temperature compensation element of the gas density relay body 1 rises (assuming rise to 45.6° C.), so a contact action occurs to the gas density relay body. The contact action is delivered to the intelligent control unit 7 via the online check contact signal sampling unit 6, and the intelligent control unit 7 obtains the gas density value according to the pressure value and the temperature value when the contact acts, or directly obtains the gas density value, detects the contact signal operating value of the gas density relay body 1, and completes the check of the contact signal operating value of the gas density relay. When the check work of all contact signals is completed, the intelligent control unit 7 opens the valve 4 and turns off the temperature regulating mechanism 5.

Embodiment VII

Figure 7:
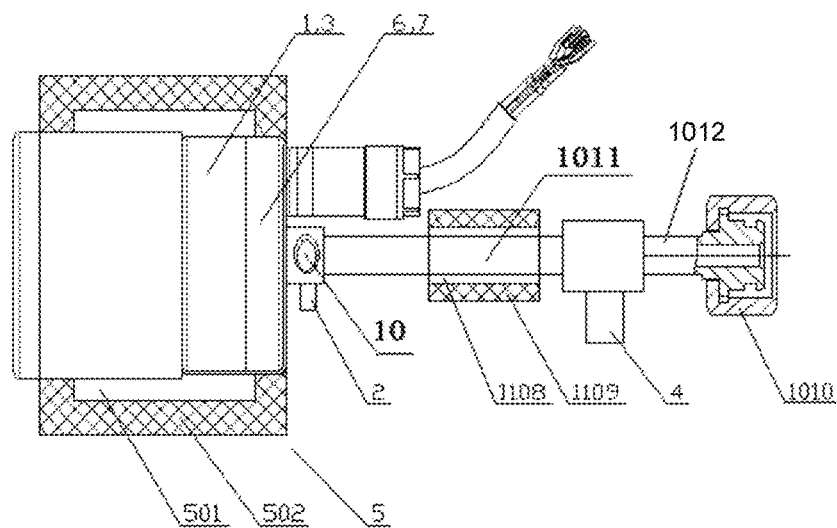
FIG. 7 is a structural schematic diagram of a gas density relay with an online self-check function in an embodiment VII.

As shown in FIG. 7, the embodiment VII of the present disclosure provides a gas density relay with an online self-check function or a gas density monitoring device. This embodiment further includes a valve 4 and a heating member 1108, one end of the valve 4 is communicated with the joint 1010 (the joint 1010 is communicated with the electrical equipment) while the other end of the valve 4 is communicated with the gas path 1012 of the gas density relay body 1, the valve 4 is also connected to the intelligent control unit 7, the heating element 1108 is arranged on the connecting pipe 1011, in which is hollow, the heating element 1108 is also connected to the intelligent control unit 7, and a heat insulation element 1109 is arranged outside the heating member 1108.

The working principle is as follows: under the condition of allowing and/or checking the gas density relay, the online check contact signal sampling unit 6 is adjusted to the check state via the intelligent control unit 7 according to the setting check time and/or check command, the gas density value situation and/or the temperature value situation. Under the check state, the online check contact signal sampling unit 6 cuts off the control loop of the contact signal of the gas density relay body 1, so that the contact of the gas density relay body 1 is connected to the intelligent control unit 7. Control heating by heating member 1108 with the intelligent control unit 7, which leads to change in temperature of the gas in the air chamber in the connecting pipe 1011 between the valve 4 and the gas density relay body 1. Use the intelligent control unit 7 to shut off the valve 4 after reaching the setting value, and then use intelligent control unit 7 to turn off the heating member 1108. After the temperature or pressure of the air chamber in the connecting pipe 1011 falls to a suitable value (for example, the ambient temperature is −10° C.), the temperature regulating mechanism 5 is controlled via the intelligent control unit 7, so that the temperature of the gas density relay rises, then the temperature of the temperature compensation element of the gas density relay body 1 rises (assuming rise to 38.5° C.), so that a contact action occurs to the gas density relay body 1, and the contact action is delivered to the intelligent control unit 7 via the online check contact signal sampling unit 6. The intelligent control unit 7 obtains the gas density value according to the pressure value and the temperature value when the contact acts, or obtains the gas density value directly, detects the contact signal operating value of the gas density relay body 1, and completes the check of the contact signal operating value of the gas density relay. Upon completion of check of all contact signals, the intelligent control unit 7 will open the valve 4 and turn off the temperature regulating mechanism 5.

In the above contents, the gas density relay with the online self-check function generally refers to the composition elements thereof being designed to an integrated structure, and the gas density monitoring device generally refers to the composition elements thereof being designed to a split structure, with flexible composition.

In conclusion, a gas density relay with an online self-check function and a check method thereof provided by the present disclosure are composed of a gas path (through a pipeline) connecting part, a temperature regulating part (even further including a pressure regulating part) and a signal measuring control part, etc. The main function is to perform the online check measurement on the contact signal (the pressure value at the alarm/blocking action) of the gas density relay under the ambient temperature and automatically converts to the corresponding pressure value at 20° C., then the performance test for the contact (alarm and blocking) value of the gas density relay is realized online. The installation positions of the gas density relay, the pressure sensor, the temperature transducer, the temperature regulating mechanism, the pressure regulating mechanism, the valve, the online check contact signal sampling unit and the intelligent control unit can be flexibly combined. For example, the gas density relay body, the pressure sensor, the temperature transducer, the online check contact signal sampling unit and the intelligent control unit can be combined together, integrally designed, separately designed, installed on the housing or the multichannel joint, or connected together through the connecting pipe. The valve may be directly connected to the electrical equipment, or connected to the electrical equipment through the self-sealing valve or the air pipe. The pressure sensor, the temperature transducer, the online check contact signal sampling unit and the intelligent control unit can be combined together or integrally designed; the pressure sensor and the temperature transducer can be combined together or integrally designed; and the online check contact signal sampling unit and the intelligent control unit can be combined together or integrally designed. In short, the structure is not limited to one type.

When the gas density relay with the online self-check function checks the density relay contact at a high temperature, a low temperature, a normal temperature and an ambient temperature of 20° C., the error judgment requirements may be different, and specifically the implementation can be carried out according to the temperature requirement and the related standards. The performance of the density relay can be judged according to the comparison of the error performance of the density relay at the different temperatures and different periods, namely, the comparison in the different periods and the same temperature range. Specifically, comparison of various periods and comparison of history and present. The density relay body may also be subjected to examination. The density relay contact signal may be checked at any time if necessary, and whether the density values of the gas density relay body and the monitored electrical equipment are normal or not is judged. Namely, the electrical system may determine, analyze and compare normalnesses and abnormities of the gas density value of the electrical equipment, the gas density relay body, the pressure sensor, and the temperature transducer, then realize monitoring the gas density of the electrical equipment, determining, comparing and analyzing the state of the density relay body, etc. The electrical equipment may further monitor the state of the contact signal of the gas density relay, and remotely transmit the state. It can be known in the background whether the state of the contact signal of the gas density relay is open or closed, so as to add a layer of monitoring and improve reliability. It can also detect or detect and judge the temperature compensation performance of the gas density relay body, detect or detect and judge the contact resistance of the gas density relay body, and detect or detect and judge the insulation performance of the gas density relay body. In addition, as far as SF6 gas, the special conversion method for the pressure-temperature characteristic of the SF6 gas may be calculated according to the Beattie-Bridgeman equation. As far as SF6 mixed gas, the special conversion method for the pressure-temperature characteristic of the SF6 mixed gas may be calculated according to the Dalton's Law of Partial Pressure, the Beattie-Bridgeman equation and the ideal gas state equation. The temperature regulating mechanism 5 may be placed inside or outside the housing of the gas density relay body, or on the housing.

The signal generator includes but is not limited to a microswitch, a magnetic assisted electric contact, a reed switch and a minor switch, and the gas density relay body outputs the contact signal via the signal generator. The pressure detector includes but is not limited a Bourdon tube, a bellow, a bellow+a spring and a pressure sensor. The temperature compensation element adopts, including but being not limited to, a temperature compensation piece, gas sealed in the housing, and gas sealed in the temperature compensation piece+the housing.

This application has compact and reasonable structure arrangement, and various components have better anti-rust and anti-vibration abilities, are firmly installed and reliably used. The connection and disassembly for various pipelines of the gas density relay are easy to operate, and the equipment and component are convenient to maintain. In this application, the gas density relay check can be completed without maintainer at the site, so as to greatly improve the reliability of power grid, increase work efficiency and reduce operating and maintenance cost.

The specific embodiments of the present disclosure are described in details above, and used as examples only. The present disclosure is not limited to the specific embodiments described above. For the personnel skilled in the art, any equal modification and replacement to the present disclosure shall be in the scope of the present disclosure. Therefore, the equal change and modification made without deviating from the spirit and scope of the present disclosure shall be covered within the scope of the present disclosure.

The invention claimed is:

1. A gas density relay with an online self-check function comprising a gas density relay body, a gas density detection sensor, a temperature regulating mechanism, an online check contact signal sampling unit and an intelligent control unit;

wherein the temperature regulating mechanism adjusts the temperature a temperature compensation element of the gas density relay body;

wherein the gas density detection sensor is connected to the gas density relay body;

wherein the online check contact signal sampling unit is directly or indirectly connected with the gas density relay body to sample contact signals generated when contacts of a signal generator of the gas density relay body take action; and wherein the intelligent control unit is respectively connected with the gas density detection sensor, the temperature regulating mechanism, and the online check contact signal sampling unit to control the temperature regulating mechanism, pressure value acquisition, temperature value acquisition and/or gas density value acquisition and to detect contact signal operating values and/or return values of the gas density relay body.

2. The gas density relay with the online self-check function according to claim 1, wherein the gas density relay body comprises a housing, a base, a pressure detector, the temperature compensation element and at least one signal generator, the base, the pressure detector, the temperature compensation element and the signal generators are arranged in the housing; each signal generator comprises a micro-switch or magnetic assisted electric contact, and the gas density relay body outputs contact signals through the signal generators; the pressure detector comprises a Bourdon tube or bellow; the temperature compensation element adopts a temperature compensation piece or gas sealed in the housing.

3. The gas density relay with the online self-check function according to claim 1, wherein the gas density detection sensor comprises at least one pressure sensor and at least one temperature transducer; the pressure sensor is installed on a gas path of the gas density relay body, the temperature transducer is installed on or outside the gas path of the gas density relay body, or installed in the gas density relay body, or installed outside the gas density relay body; or the gas density detection sensor is a gas density transmitter comprising the pressure sensors and the temperature transducers; or, the gas density detection sensor is a density detection sensor adopting a quartz tuning fork technology.

4. The gas density relay with the online self-check function according to claim 1, wherein the intelligent control unit acquires the gas density values collected by the gas density detection sensor when the gas density relay body performs contact signal operating or switching, and online check of the gas density relay is achieved; or, The intelligent control unit acquires the pressure value and temperature value collected by the gas density sensor when the contact signal of the gas density relay body is operated or switched, and converts them into the pressure value corresponding to 20° C. according to the gas pressure-temperature characteristics, that is, the gas density value, and completes the online check of the gas density relay.

5. The gas density relay with the online self-check function according to claim 1, wherein the gas density relay further comprises a pressure regulating mechanism, and a gas path of the pressure regulating mechanism is communicated with the gas density relay body; the pressure regulating mechanism is configured to regulate pressure rise and fall of the gas density relay body to be matched and/or combined with the temperature regulating mechanism, and the intelligent control unit is connected with the pressure regulating mechanism to complete control of the pressure regulating mechanism; or, the gas density relay (or gas density monitoring device) further includes a heating member, and the intelligent control unit is connected with the heating member; alternatively, the gas density relay (or gas density monitoring device) further includes an air chamber and a heating member, the air chamber is communicated with the gas density relay body, the heating member is arranged outside or inside the air chamber, and the intelligent control unit is connected with the heating member.

6. The gas density relay with the online self-check function according to claim 5, wherein the pressure regulating mechanism is a closed air chamber, a heating element and/or a refrigeration element is arranged outside or inside the closed air chamber; during check, heating is achieved through the heating element, and/or refrigeration is achieved through the refrigeration element, so that the temperature of gas in the closed air chamber is changed, and pressure rise and fall of the gas density relay is completed; or the pressure regulating mechanism is a cavity with an opening at one end, and the other end of the cavity is communicated with the gas density relay body; a piston is arranged in the cavity, one end of the piston is connected with a regulating rod, the outer end of the regulating rod is connected with a drive part, the other end of the piston extends into the opening and hermetically contacts with the inner wall of the cavity, and the drive part drives the regulating rod to drive the piston to move in the cavity; or the pressure regulating mechanism is a closed air chamber, a piston is arranged in the closed air chamber, the piston hermetically contacts with the inner wall of the closed air chamber, and a drive part is arranged outside the closed air chamber and pushes the piston to move in the cavity through electromagnetic force; or the pressure regulating mechanism is an airbag with one end connected with the drive part, the volume of the airbag is changed under drive of the drive part, and the airbag is communicated with the gas density relay body; or the pressure regulating mechanism is a bellow, one end of the bellow is communicated with the gas density relay body, and the other end of the bellow extends and retracts under the drive of the drive part; or the pressure regulating mechanism is a deflation valve, which is a solenoid valve or a valve with electrically motorized operation; or the pressure regulating mechanism is a compressor; or the pressure regulating mechanism is a pump, and the pump comprises but is not limited to one of a pressure pump, a booster pump, an electrical gas pump and an electromagnetic gas pump;

wherein the drive part comprises one of a magnetic force, an electric motor, a reciprocating motion mechanism, a Carnot cycle mechanism, and a pneumatic element.

7. A modification method for the gas density relay according to claim 1, wherein the modification method comprises the following steps:

the gas density detection sensor is communicated with the gas density relay body;

the gas path of the gas density detection sensor is connected with a first connector of the multichannel joint;

the temperature regulating mechanism is arranged inside or outside the housing of the gas density relay body and regulates temperature rise and fall of the temperature compensation element of the gas density relay body, so that the gas density relay body takes contact signal action;

the online check contact signal sampling unit is directly or indirectly connected with the gas density relay body and samples contact signals generated when the contacts of the gas density relay body take action;

the intelligent control unit is respectively connected with the gas density detection sensor, the temperature regulating mechanism and the online check contact signal sampling unit and configured to complete control of the temperature regulating mechanism, pressure value acquisition, temperature value acquisition and/or gas density value acquisition and detect contact signal operating values and/or contact signal return values of the gas density relay body;

the contact signals include alarm signals and/or blocking signals.

8. The modification method for the gas density relay according to claim 7, wherein the method comprises the following step:

a gas path of the pressure regulating mechanism is communicated with the gas density relay body; the pressure regulating mechanism is configured to regulate pressure rise and fall of the gas density relay body to be matched and/or combined with the temperature regulating mechanism, so that the gas density relay body takes contact signal action, and the pressure regulating mechanism is also connected with the intelligent control unit, so that the pressure regulating mechanism works under the control of the intelligent control unit; and/or one end of the valve is communicated with the electrical equipment, and the other end of the valve is communicated with the gas density relay body; the valve is also connected with the intelligent control unit, to achieve the closing or opening of the valve under the control of the intelligent control unit.

9. A check method for the gas density relay with the online self-check function according to claim 1, wherein the check method comprises the following steps: in a normal working state, the gas density relay monitors the gas density value in the electrical equipment;

under the condition of allowing to check the gas density relay, and according to the setting check time and/or check command, the gas density value situation and/or the temperature value situation:

the temperature regulating mechanism is controlled via the intelligent control unit, so that the temperature of the gas density relay rises, then the temperature of the temperature compensation element of the gas density relay body rises, so that the gas density relay body takes contact action, and the contact action is transmitted to the intelligent control unit via the online check contact signal sampling unit; the intelligent control unit acquires the gas density value according to the pressure value and the temperature value in the contact action, or acquires the gas density value directly, detects the contact signal operating value of the gas density relay body, and completes the check of the contact signal operating value of the gas density relay;

upon completion of check of all contact signals, the intelligent control unit shuts off the heating element of the temperature regulating mechanism.

10. The check method for the gas density relay according to claim 9, wherein the method comprises the following step:

in a normal working state, the gas density relay monitors the gas density value in the electrical equipment, and at the same time, the gas density relay monitors the gas density value in the electrical equipment online via a gas density detection sensor and the intelligent control unit;

under the condition of allowing to check the gas density relay, and according to the setting check time and/or check command, the gas density value situation and/or the temperature value situation:

the online check contact signal sampling unit is adjusted into a check state via the intelligent control unit; in the check state, the online check contact signal sampling unit cuts off a control loop of the contact signals of the gas density relay body, and contacts of the gas density relay body are connected to the intelligent control unit;

the temperature regulating mechanism is controlled via the intelligent control unit, so that the temperature of the gas density relay rises, then the temperature of the temperature compensation element of the gas density relay body rises, so that the gas density relay body takes contact action, and the contact action is transmitted to the intelligent control unit via the online check contact signal sampling unit; the intelligent control unit acquires the gas density value according to the pressure value and the temperature value in the contact action, or acquires the gas density value directly, detects the contact signal operating value of the gas density relay body, and completes the check of the contact signal operating value of the gas density relay;

the temperature regulating mechanism is controlled via the intelligent control unit, so that the temperature of the gas density relay is reduced, then the temperature of the temperature compensation element of the gas density relay body is reduced, so that contact reset occurs to the gas density relay body, and then the contact reset is transmitted to the intelligent control unit via the online check contact signal sampling unit; the intelligent control unit acquires the gas density value according to the pressure value and the temperature value in the contact reset, or acquires the gas density value directly, detects the contact signal return value of the gas density relay body, and completes the check of the contact signal return value of the gas density relay;

when the check of the contact signals are completed, the heating element of the temperature regulating mechanism is turned off by the intelligent control unit; the online check contact signal sampling unit is adjusted into a working state; a control loop of the contact signals of the gas density relay is recovered to a normal working state.

11. The check method for the gas density relay according to claim 9, wherein the gas density relay further comprises a valve and a pressure regulating mechanism, the gas path of the pressure regulating mechanism is communicated with that of the gas density relay body, a connector communicated with the electrical equipment is arranged at one end of the valve, and the other end of the valve is communicated with the gas path of the gas density relay body; and the check method further comprises:

in a normal working state, the gas density relay monitors the gas density value in the electrical equipment;

under the condition of allowing to check the gas density relay, and according to the setting check time and/or check command, the gas density value situation and/or the temperature value situation:

the valve is closed via the intelligent control unit;

the pressure regulating mechanism is driven via the intelligent control unit, so that gas pressure falls slowly, then the temperature regulating mechanism is controlled via the intelligent control unit, the temperature of the gas density relay rises, the temperature of the temperature compensation element of the gas density relay body rises, so that the gas density relay body takes contact action, and the contact action is transmitted to the intelligent control unit via the online check contact signal sampling unit; the intelligent control unit acquires the gas density value according to the pressure value and the temperature value in the contact action, or acquires the gas density value directly, detects the contact signal operating value of the gas density relay body, and completes the check of the contact signal operating value of the gas density relay;

when the check of all the contact signals are completed, the intelligent control unit opens the valve and shuts off the heating element of the temperature regulating mechanism.

12. The check method for the gas density relay according to claim 9, wherein the gas density relay further comprises a valve and a pressure regulating mechanism, the gas path of the pressure regulating mechanism is communicated with that of the gas density relay body, a connector communicated with the electrical equipment is arranged at one end of the valve, and the other end of the valve is communicated with the gas path of the gas density relay body; and the check method further comprises:

in a normal working state, the gas density relay monitors the gas density value in the electrical equipment, and at the same time, the gas density relay monitors the gas density value in the electrical equipment online via a gas density detection sensor and the intelligent control unit;

under the condition of allowing to check the gas density relay, and according to the setting check time and/or check command, the gas density value situation and/or the temperature value situation:

the valve is closed via the intelligent control unit;

the online check contact signal sampling unit is adjusted into a check state via the intelligent control unit; in the check state, the online check contact signal sampling unit cuts off a control loop of the contact signals of the gas density relay body, and contacts of the gas density relay body are connected to the intelligent control unit;

the temperature regulating mechanism is controlled via the intelligent control unit, so that the temperature of the gas density relay rises, then the temperature of the temperature compensation element of the gas density relay body rises, the pressure regulating mechanism is driven through the intelligent control unit, so that gas pressure falls slowly, the gas density relay body takes contact action, and the contact action is transmitted to the intelligent control unit via the online check contact signal sampling unit; the intelligent control unit acquires the gas density value according to the pressure value and the temperature value in the contact action, or acquires the gas density value directly, detects the contact signal operating value of the gas density relay body, and completes the check of the contact signal operating value of the gas density relay;

the temperature regulating mechanism is controlled via the intelligent control unit, so that the temperature of the gas density relay is reduced, then the temperature of the temperature compensation element of the gas density relay body is reduced, the pressure regulating mechanism is driven via the intelligent control unit, so that gas pressure rises slowly, so that contact reset occurs to the gas density relay body, and then the contact reset is transmitted to the intelligent control unit via the online check contact signal sampling unit; the intelligent control unit acquires the gas density value according to the pressure value and the temperature value in the contact reset, or acquires the gas density value directly, detects the contact signal return value of the gas density relay body, and completes the check of the contact signal return value of the gas density relay;

when the check of all the contact signals are completed, the intelligent control unit opens the valve and shuts off the heating element of the temperature regulating mechanism, the online check contact signal sampling unit is adjusted into a working state, and the control loop of the contact signals of the gas density relay is recovered to a normal working state.

13. The check method for the gas density relay according to claim 9, wherein the gas density relay further comprises a heating member and a valve, the heating member is connected with the intelligent control unit, a connector communicated with the electrical equipment is arranged at one end of the valve, and the other end of the valve is communicated with the gas path of the gas density relay body; and the check method further comprises:

in a normal working state, the gas density relay monitors the gas density value in the electrical equipment, and at the same time, the gas density relay monitors the gas density value in the electrical equipment online via a gas density detection sensor and the intelligent control unit;

under the condition of allowing to check the gas density relay, and according to the setting check time and/or check command, the gas density value situation and/or the temperature value situation:

the online check contact signal sampling unit is adjusted into a check state via the intelligent control unit; in the check state, the online check contact signal sampling unit cuts off a control loop of the contact signals of the gas density relay body, and contacts of the gas density relay body are connected to the intelligent control unit;

heating by heating member is controlled by the intelligent control unit, which leads to change in temperature of gas in air chamber, the intelligent control unit is used to shut off the valve after reaching the setting value, and then the intelligent control unit is used to turn off the heating member;

after the temperature or pressure of the gas density relay falls to a setting value, the temperature regulating mechanism is controlled via the intelligent control unit, so that the temperature of the gas density relay rises, then the temperature of the temperature compensation element of the gas density relay body rises, so that a contact action occurs to the gas density relay body, the contact action is delivered to the intelligent control unit via the online check contact signal sampling unit, the intelligent control unit obtains the gas density value according to the pressure value and the temperature value when the contact acts, or obtains the gas density value directly, detects the contact signal operating value of the gas density relay body, and completes the check of the contact signal operating value of the gas density relay;

when the check of all the contact signals are completed, the intelligent control unit opens the valve and shuts off the temperature regulating mechanism.

\* \* \* \* \*